United States Patent
Kono et al.

(10) Patent No.: US 6,229,753 B1
(45) Date of Patent: May 8, 2001

(54) SEMICONDUCTOR MEMORY DEVICE CAPABLE OF ACCURATE CONTROL OF INTERNALLY PRODUCED POWER SUPPLY POTENTIAL

(75) Inventors: Takashi Kono; Katsuyoshi Mitsui, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/576,229

(22) Filed: May 22, 2000

(30) Foreign Application Priority Data

Aug. 31, 1999 (JP) ................................................ 11-245239

(51) Int. Cl.$^7$ ...................................................... G11C 8/00
(52) U.S. Cl. ......................... 365/230.03; 365/53; 365/63; 365/189.11
(58) Field of Search ............................... 365/230.03, 53, 365/63, 52, 230.01, 189.11, 189.01

(56) References Cited

U.S. PATENT DOCUMENTS 5,699,289 * 12/1997 Takenaka ............................... 365/51
6,064,621 * 5/2000 Tanizaki et al. ................ 365/230.03

FOREIGN PATENT DOCUMENTS 7-297375   11/1995 (JP).
8-195083    7/1996 (JP).

* cited by examiner

Primary Examiner—David Nelms
Assistant Examiner—Hoai V. Ho
(74) Attorney, Agent, or Firm—McDermott, Will & Emery

(57) ABSTRACT

A Vpp level detecting circuit detects a potential on a Vpp trunk line which is provided commonly to a plurality of memory array banks for supplying a boosted potential thereto, and a boosted potential pump circuit supplies a current to the Vpp trunk line in accordance with a result of the detection. Since the position on the Vpp trunk line where the Vpp level detecting circuit performs the monitoring is substantially equally spaced from the respective memory blocks, an influence caused by an active state of the memory array bank can be suppressed during control of the potential on the Vpp trunk line.

11 Claims, 19 Drawing Sheets

SEMICONDUCTOR MEMORY DEVICE CAPABLE OF ACCURATE CONTROL OF INTERNALLY PRODUCED POWER SUPPLY POTENTIAL

BACKGROUND OF THE INVENTION

1. Field of the Invention

The present invention relates to a semiconductor memory device, and particularly a semiconductor memory device including a power supply circuit generating an internal power supply potential.

2. Description of the Background Art

In recent years, transistor miniaturizing technologies have been remarkably developed so that transistors mounted on a semiconductor chip have dramatically increased in number. This achieves a large capacity of a semiconductor memory device such as a Dynamic Random Access Memory (DRAM), and also achieves a one-chip structure of a memory and a logic circuit. Also, an external power supply ext.Vdd supplied to a chip can be reduced, and thereby a current consumption can be reduced. Owing to this, the device can be employed in a battery-powered instrument.

However, in view of reliability of a transistor, it is difficult to use external power supply potential ext.Vdd as a drive power supply potential of transistors without lowering it, although a low potential is used as external power supply potential ext.Vdd. A further lower potential is required as an internal power supply voltage Vdd. It is also necessary to generate internal potentials such as a substrate potential Vbb for controlling a threshold voltage Vth of the transistor, and a boosted potential (Vpp) for sufficiently increasing the gate potential of the transistor and thereby allowing sufficient transmission of the power supply potential level by the transistor.

Among various potentials which are internally generated, a boosted potential Vpp used in a synchronous DRAM (SDRAM) will now be discussed. The boosted potential Vpp is the highest potential among those used in the chip, and must be determined most carefully in view of reliability of the transistor.

FIG. 20 shows a typical example of an arrangement of a boosted potential generating circuit system and boosted potential power supply lines in the prior art.

Referring to FIG. 20, a semiconductor memory device 860 has a rectangular semiconductor substrate. Memory array banks 862a, 862b, 862c and 862d each having a rectangular form are arranged in positions on the substrate corresponding to the respective corners.

A central region CRS extends along a line connecting midpoints of the opposite short sides of semiconductor substrate together. The device is provided at central region CRS with a Vref generating circuit 834 which generates a reference potential Vrefd forming a reference of boosted potential Vpp, a Vpp level detecting circuit 832 which refers to reference potential Vrefd, and thereby can detect the fact the level on a boosted potential power supply line becomes lower than an desired value, and Vpp pump circuits 836a and 836b which apply the boosted potential to the boosted potential power supply line in accordance with a signal VPLOW activated in accordance with the result of detection.

The boosted potential power supply line has a ring-like form. The boosted potential power supply line includes a portion 866 connected to Vpp pump circuit 836a and Vpp level detecting circuit 832, portions 864a, 864b, 864c and 864d, which are arranged on memory array banks 862a, 862b, 862c and 862d, respectively, and a portion 868 connected to Vpp pump circuit 836b.

The boosted potential power supply line further includes a portion 865 connecting portions 864a and 864c together, and a portion 867 connecting portions 864b and 864d together. Portions 866, 864a, 865, 864c, 868, 864d, 867 and 864b of the boosted potential power supply line are connected in this order to form a ring-like connection around central region CRS.

This boosted potential power supply line in the ring-like form is called a Vpp trunk line. The Vpp trunk line is commonly used by the four memory array banks, and the level on the Vpp trunk line is always monitored by Vpp level detecting circuit 832. Each bank is independently selected and activated.

When the unselected bank is selected, or the selected bank is set to the unselected state, the current is consumed, and the current corresponding to the this current consumption is supplied from the boosted potential power supply line to each bank. Thereby, Vpp level detecting circuit 832 detects lowering of level on the boosted potential power supply line. Signal VPLOW is activated to attain H-level. Thereby, Vpp pump circuits 836a and 836b are activated, and the potential level on the boosted potential power supply line rises.

For stabilizing boosted potential Vpp, it is effective to increase the speed of response of the Vpp level detecting circuit and to prepare a sufficient decouple capacity (not shown). Increase in speed of response of the Vpp level detecting circuit results in increase in current consumption of the Vpp level detecting circuit. During a standby, however, the current consumption with the boosted potential hardly occurs, and therefore the standby current can be reduced by employing another Vpp level detecting circuit dedicated to the standby.

Since boosted potential Vpp is high, a gate area may be restricted due to restrictions on reliability of the device when an MOS capacity is utilized as a capacitor used in a pump circuit. A boosted potential generating Circuit system is designed in consideration of the above.

However, if the raised power supply potential monitored by the Vpp level detecting circuit does not reflect the current consumption with the actual raised power supply potential in the most faithful fashion, even the design of the boosted potential generating circuit system having an optimum performance becomes less significant. In particular, the array structure of, e.g., an SDRAM is formed of a plurality of memory array banks, and the current consumption on the Vpp trunk line may not occur uniformly in a chip including such an array structure. It is now assumed in FIG. 20 that Vpp pump circuits 836a and 836b supply equal currents, when the current is being consumed by activation of memory array banks 862c and 862d. In this case, the voltage drop occurs due to a resistance component of the boosted potential power supply line itself even if Vpp level detecting circuit 832 performs the control to place a desired potential on the boosted potential power supply line. Therefore, the potentials on the portions near memory array banks 862c and 862d may lower slightly below the desired potentials.

However, it is desired to arrange the Vpp level detecting circuit only in one position for avoiding increase in layout area and complication of control.

FIG. 21 shows an example of layout of a conventional power supply circuit.

In a conventional structure shown in FIG. 21, power supply circuits 920 and 930 including Vpp pump circuits, decouple capacities and others occupy an extremely large area. Therefore, these circuits are often arranged in portions of central region CRS near the outer periphery of the chip. As a result, these are often located in the positions remote from consumption portions where boosted potential Vpp is used and thereby the current is actually consumed. Therefore, such a problem arises that interconnection resistances which are present between the consumption portions and power supply circuits 920 and 930 impede smooth supply of currents.

SUMMARY OF THE INVENTION

An object of the invention is to provide a semiconductor memory device, in which a detecting circuit is arranged for accurately and equally monitoring an internally produced potential such as a boosted potential Vpp, and an arrangement of power supply interconnections are devised to allow such monitoring so that the level of the generated potential can be stable. Further, an arrangement of a potential generating source such as a Vpp pump circuit is devised to provide the more stable internal potential.

In summary, a semiconductor memory device of the invention includes first and second memory blocks, a trunk line and an internal power supply potential generating circuit.

The first and second memory blocks are arranged in positions opposed to each other with a central region therebetween, and are arranged along a first direction. The trunk line is provided commonly to the first and second memory blocks for transmitting an internal power supply potential. The trunk line includes a first portion provided corresponding to the first memory block, and arranged on a portion of the central region near the first memory block and along a second direction perpendicular to the first direction, a second portion provided corresponding to the second memory block, and arranged on a portion of the central region near the second memory block along the second direction, and a third portion connecting a substantial mid-point of the first portion and a substantial mid-point of the second portion together, and arranged along the first direction. The internal power supply potential generating circuit issues an internal power supply potential to the trunk line. The internal power supply potential generating circuit includes a reference potential generating circuit for generating a reference potential, a detecting circuit arranged in the central region for performing potential detection by monitoring and comparing the potential on the third portion with the reference potential, and a potential drive circuit for driving the potential on the trunk line in accordance with the output of the detecting circuit.

According to another aspect of the invention, a semiconductor memory device to be arranged on a semiconductor substrate, includes a memory block, an interconnection group, an internal power supply circuit and a shield layer. The interconnection group transmits data to and from the memory block. The internal power supply potential generating circuit supplies an internal power supply potential to the memory block. The internal power supply potential generating circuit includes a reference potential generating circuit for generating a reference potential, a detecting circuit for performing potential detection by monitoring and comparing the internal power supply potential with the reference potential, and a potential drive circuit for driving the internal power supply potential in accordance with the output of the detecting circuit. The potential drive circuit includes a capacitor having at least a portion formed in an interconnection region provided with the interconnection group. The shield layer is arranged between the capacitor and the interconnection group, and is supplied with a fixed potential.

Accordingly, a major advantage of the invention is to enable accurate detention and control of the internally generated potential in the case where a plurality of memory blocks are activated in accordance with different timing settings, as is done, e.g., in a semiconductor memory device of a multi-bank structure.

As another advantage of the invention, the potential drive circuit for supplying a boosted potential Vpp or the like to the trunk line can be arranged more flexibly, and can be disposed near a load circuit such as a memory array consuming the current. Further, a data line and a control signal line are shielded from a node of a capacitor included in the potential drive circuit so that transmission of noises, which are caused by a pump operation, onto the data line and control signal line can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in detail with reference to the drawings. In the figures, the same or corresponding portions bear the same reference numbers.

The following description is given by way of example to a voltage lowering circuit in an SDRAM having a 4-bank structure. Naturally, the invention can be applied to a structure having banks other than four in number.

FIRST EMBODIMENT

Figure 1:
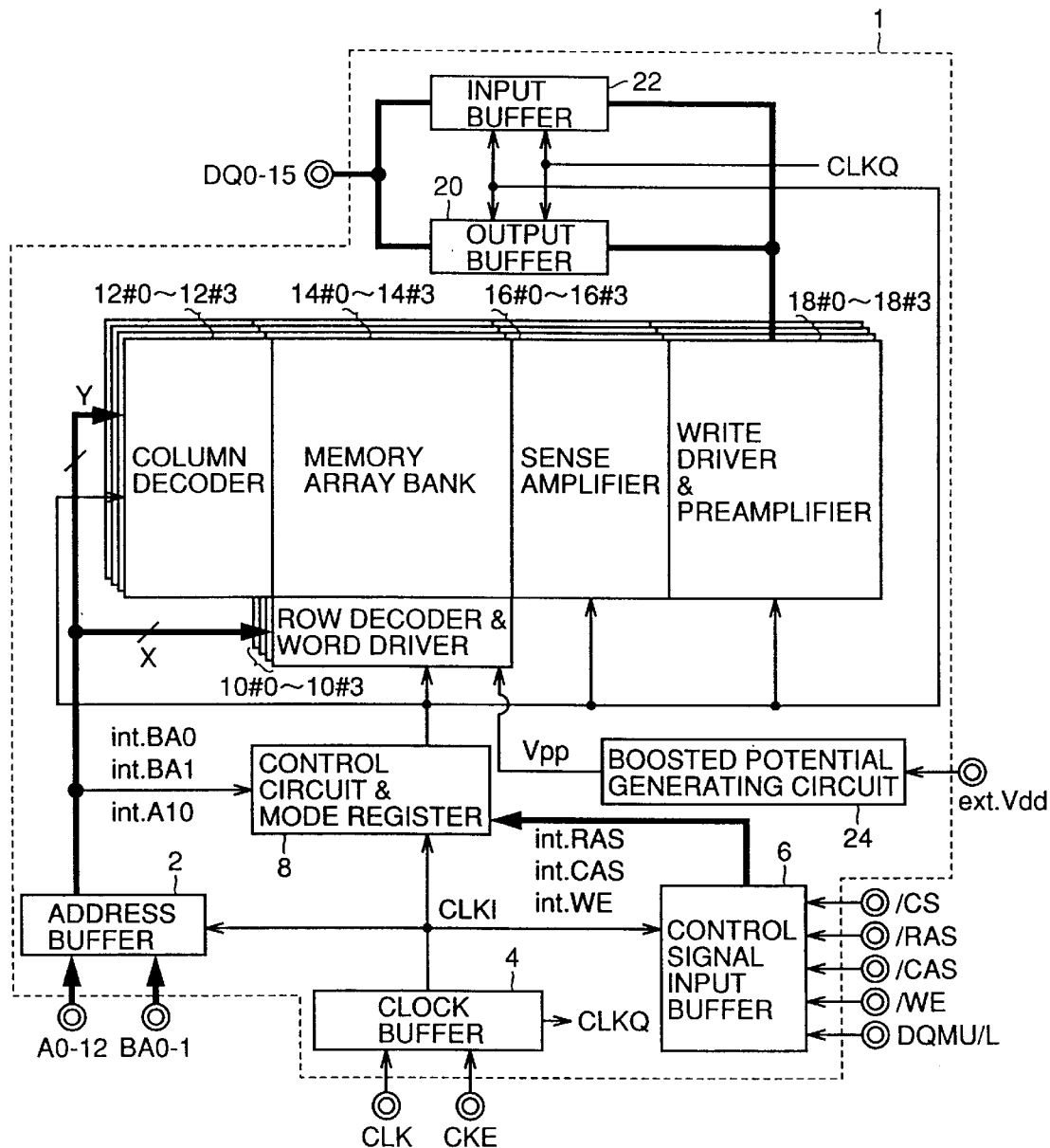
FIG. 1 is a schematic block diagram showing a structure of a semiconductor memory device 1 of a first embodiment of the invention.

FIG. 1 is a schematic block diagram showing a structure of a semiconductor memory device 1 of a first embodiment of the invention.

Referring to FIG. 1, semiconductor memory device 1 includes memory array banks 14#0–14#3 each having a plurality of memory cells arranged in a matrix form, an address buffer 2 which takes in externally applied address signals A0–A12 and bank address signals BA0 and BA1 in synchronization with a clock signal CLKI, and issues an internal row address, an internal column address and an internal bank address, a clock buffer 4 which receives a clock signal CLK and a clock enable signal CKE both supplied externally thereto, and issues clock signals CLKI and CLKQ to be used within the semiconductor memory device, and a control signal input buffer 6 which takes in externally applied control signals /CS, /RAS, /CAS and /WE as well as an externally applied mask signal DQMU/L in synchronization with clock signal CLKI.

Semiconductor memory device 1 also includes a control circuit which receives internal address signals int.A0–int.A12 and internal bank address signals int.BA0 and int.BA1 from address buffer 2, receives control signals int.RAS, int.CAS and int.WE synchronized with the clock signal from control signal input buffer 6, and issues the control signals to the respective blocks in synchronization with clock signal CLKI. Further, semiconductor memory device 1 includes a mode register holding the operation mode instructed by the combination of the externally applied address. In FIG. 1, the control circuit and the mode register are depicted as one block 8. The control circuit includes a bank address decoder which decodes internal bank address signals int.BA0 and int.BA1 as well as a command decoder which receives and decodes control signals int.RAS, int.CAS and int.WE.

The semiconductor memory device 1 further includes row decoders which are provided corresponding to memory array banks 14#0–14#3 for decoding a row address signal X sent from address buffer 2, respectively, and word drivers which are provided corresponding to memory array banks 14#0–14#3 for driving the address-designated rows (word lines) in the respective memory array banks 14#0–14#3 to the selected state in accordance with the output signals of the row decoders, respectively. In FIG. 1, the row decoders and the word drivers corresponding thereto are depicted in combined forms as blocks 10#0–10#3, respectively.

Semiconductor memory device 1 further includes column decoders 12#0–12#3 which generate a column select signal by decoding an internal column address signal Y sent from address buffer 2, and sense amplifiers 16#0–16#3 which perform detection and amplification of data of the memory cells connected to the selected rows in memory array banks 14#0–14#3, respectively.

Semiconductor memory device 1 further includes an input buffer 22 which receives externally supplied write data, and produces internal write data therefrom, write drivers which amplify the internal write data sent from input buffer 22, and transmit it to the selected memory cells, preamplifiers which amplify the data read from the selected memory cells, and an output buffer 20 which buffers and externally outputs the data sent from the preamplifier.

The preamplifiers and the write drivers are provided corresponding to memory array banks 14#0–14#3, respectively. In FIG. 1, the preamplifiers and the write drivers corresponding thereto are depicted in combined forms as blocks 18#0–18#3, respectively. Input buffer 22 and output buffer 20 receive clock signal CLKQ from clock buffer 4, and externally transmit the data via terminals DQ0–DQ15 in synchronization with clock signal CLKQ.

Semiconductor memory device 1 further includes a boosted potential generating circuit 24, which receives externally supplied power supply potential ext.Vdd, and internally supplies power supply potential Vpp to the respective blocks.

Figure 2:
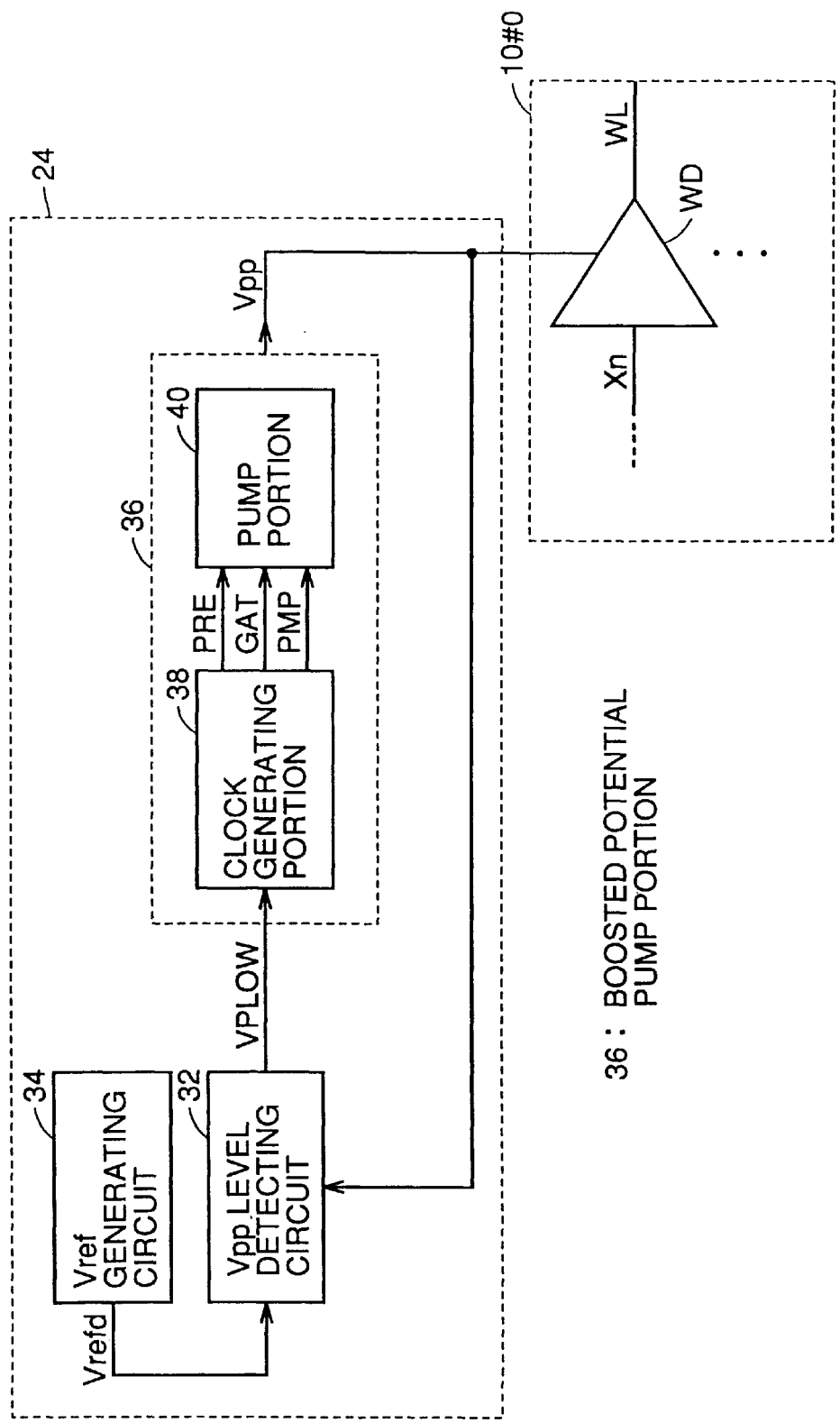
FIG. 2 is a schematic block diagram showing a structure of a boosted potential generating circuit 24 shown in FIG. 1.

FIG. 2 is a schematic block diagram showing a structure of a boosted potential generating circuit 24 shown in FIG. 1.

Referring to FIG. 2, boosted potential generating circuit 24 includes a Vref generating circuit 34 generating a reference potential Vrefd, which has a predetermined relationship with respect to a target value of boosted potential Vpp, a Vpp level detecting circuit 32 which receives boosted potential Vpp to compare it with reference potential Vrefd after converting the boosted potential Vpp into a lower potential, and issues an activating signal VPLOW in accordance with the result of comparison, a boosted potential pump circuit 36 which is activated in response to activating signal VPLOW, and thereby issues a charging current to the boosted potential power supply line. The boosted potential power supply line supplies a boosted potential, which is the power supply potential driving the H-level issued from word driver WD included in each of blocks 10#0–10#3 of the row decoders and word drivers shown in FIG. 1.

The boosted potential pump circuit 36 includes a clock generating portion 38 which is activated by activating signal VPLOW and thereby generates clock signals PRE, GAT and PMP, and a pump portion 40 which performs a potential raising operation in accordance with clock signals PRE, GAT and PMP.

Figure 3:
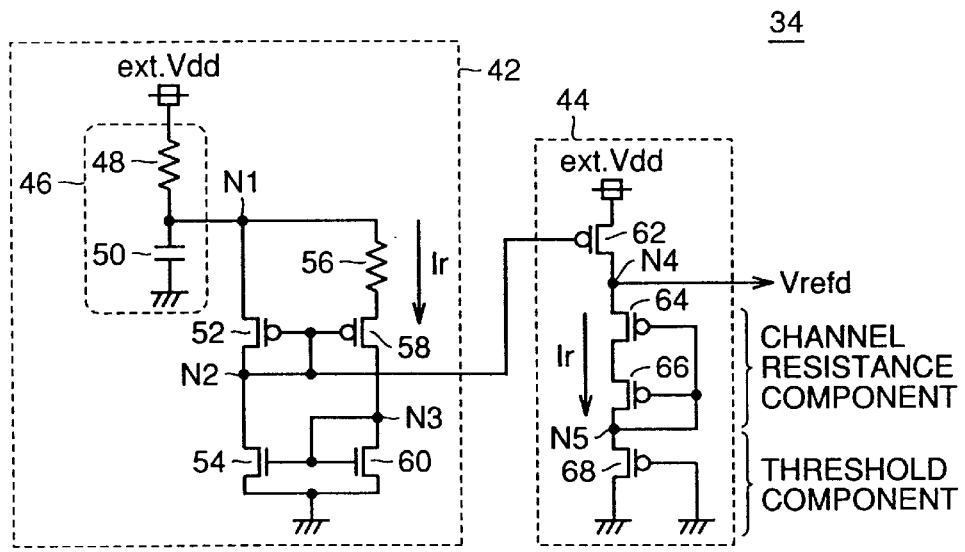
FIG. 3 is a circuit diagram showing a structure of a Vref generating circuit 34 in FIG. 2.

FIG. 3 is a circuit diagram showing a structure of Vref generating circuit 34 in FIG. 2.

Referring to FIG. 3, Vref generating circuit 34 includes a constant current supply circuit 42 and a voltage output circuit 44 which issues reference potential Vrefd under the control of constant current supply circuit 42.

Constant current supply circuit 42 includes a low-pass filter 46 which receives external power supply potential ext.Vdd and transmits it to a node N1 after removing noises, a P-channel MOS transistor 52 which has a source connected to node N1, and also has a gate and a drain both connected to a node N2, an N-channel MOS transistor 54 which is connected between node N2 and the ground node, and has a gate connected to a node N3, a resistance 56 and a P-channel MOS transistor 58 which are connected in series between nodes N1 and N3, and an N-channel MOS transistor 60 which has a drain and a gate both connected to node N3, and also has a source connected to the ground node. A gate of P-channel MOS transistor 58 is connected to node N2.

Low-pass filter 46 includes a resistance 48 which is connected between a node supplied with external power supply potential ext.Vdd and node N1, and a capacitor 50 which is connected between node N1 and the ground node.

Voltage output circuit 44 includes a P-channel MOS transistor 62 which is connected between the node supplied with external power supply potential ext.Vdd and a node N4, and has a gate connected to node N2, P-channel MOS transistors 64 and 66 which are connected in series between nodes N4 and N5, and have gates connected to node N5, and a P-channel MOS transistor 68 which has a source connected to node N5, and also has a gate and a drain both connected to the ground node.

Reference potential Vrefd is issued from node N4.

Figure 4:
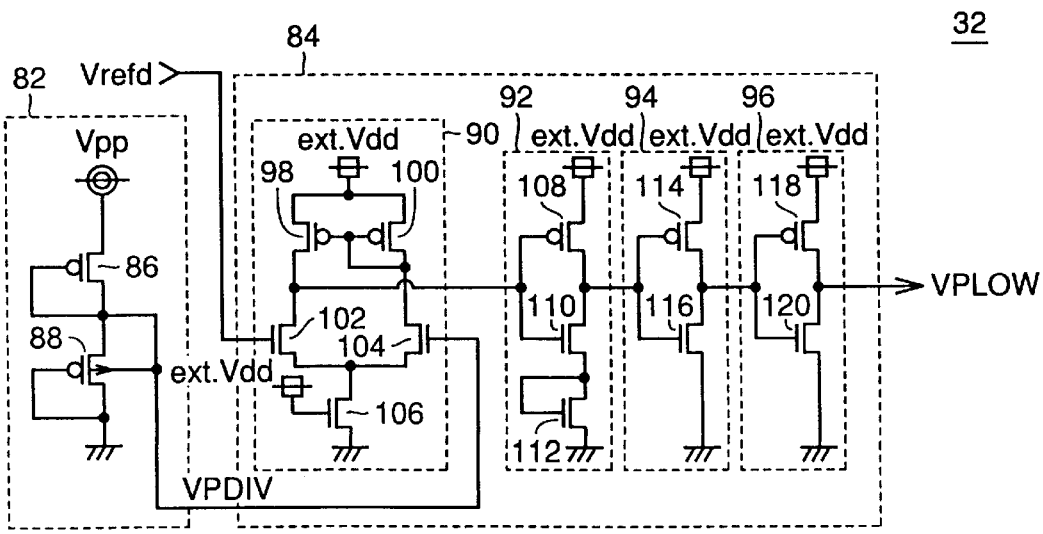
FIG. 4 is a circuit diagram showing a specific structure of a Vpp level detecting circuit 32 in FIG. 2.

FIG. 4 is a circuit diagram showing a specific structure of Vpp level detecting circuit 32 in FIG. 2.

Referring to FIG. 4, Vpp level detecting circuit 32 includes a divider circuit 82 which receives and divides boosted potential Vpp into a half potential VPDIV, and a comparator circuit 84 which compares potential VPDIV with reference potential Vrefd, and activates activating signal VPLOW to attain H-level when potential VPDIV is lower than reference potential Vrefd.

Divider circuit 82 includes a P-channel MOS transistor 86 which has a source coupled to boosted potential Vpp, and also has a gate and a drain connected together, and a P-channel MOS transistor 88 which has a gate and a drain both connected to the ground node, and also has a source and a back gate both connected to the drain of P-channel MOS transistor 86. Potential VPDIV is issued from the drain of P-channel MOS transistor 86.

Comparator circuit 84 includes a comparator portion 90 which compares potential VPDIV with reference potential Vrefd, and inverters 92, 94 and 96 connected in series for receiving the output of comparator portion 90. The output of inverter 96 forms activating signal VPLOW.

Comparator portion 90 includes a P-channel MOS transistor 100 which has a source connected to external power supply potential ext.Vdd, and also includes a drain and a source connected together, a P-channel MOS transistor 98 which has a source connected to external power supply potential ext.Vdd and a gate connected to the drain of P-channel MOS transistor 100, an N-channel MOS transistor 106 which has a gate coupled to external power supply potential ext.Vdd and a source connected to the ground node, an N-channel MOS transistor 102 which is connected between the drain of P-channel MOS transistor 98 and the drain of N-channel MOS transistor 106, and receives reference potential Vrefd on its gate, and an N-channel MOS transistor 104 which is connected between the drain of P-channel MOS transistor 100 and the drain of N-channel MOS transistor 106, and receives potential VPDIV on its gate.

N-channel MOS transistor 102 has a drain from which the output signal of this comparator portion is issued. Inverter 92 includes an N-channel MOS transistor 112 which has a source connected to the ground node, and also has a gate and a drain connected together, an N-channel MOS transistor 110 which receives on its gate the output of comparator portion 90, and has a source connected to the drain of N-channel MOS transistor 112, and a P-channel MOS transistor 108 which has a source coupled to external power supply potential ext.Vdd, a drain connected to the drain of N-channel MOS transistor 110 and a gate receiving the output of comparator portion 90.

The output signal of inverter 92 is issued from the drain of P-channel MOS transistor 108.

Inverter 94 includes a P-channel MOS transistor 114 and an N-channel MOS transistor 116, which are connected in series between the power supply node supplied with external power supply potential ext.Vdd and the ground node, and both receive the output of inverter 92 on their gates. The output signal of inverter 94 is issued from the connection node between P- and N-channel MOS transistors 114 and 116.

Inverter 96 includes a P-channel MOS transistor 118 and an N-channel MOS transistor 120, which are connected in series between the power supply node supplied with external power supply potential ext.Vdd and the ground node, and both receive the output of inverter 94 on their gates. Activating signal VPLOW is issued from the connection node between P- and N-channel MOS transistors 118 and 120.

Potential VPDIV will now be discussed. In divider circuit 82, P-channel MOS transistors 86 and 88 have equal transistor sizes. Since the back gate of P-channel MOS transistor 88 is connected to the source, P-channel MOS transistors 86 and 88 operate under the completely same conditions. Accordingly, potential VPDIV accurately goes to half the boosted potential Vpp. Comparator circuit 84 compares potential VPDIV with reference potential Vrefd. Accordingly, the target value of boosted potential Vpp is equal to double the reference potential Vrefd. Comparator circuit 84 activates activating signal VPLOW to attain H-level in the case of Vpp <2Vrefd, and deactivates activating signal VPLOW to attain L-level in the case of Vpp >2Vrefd.

Figure 5:
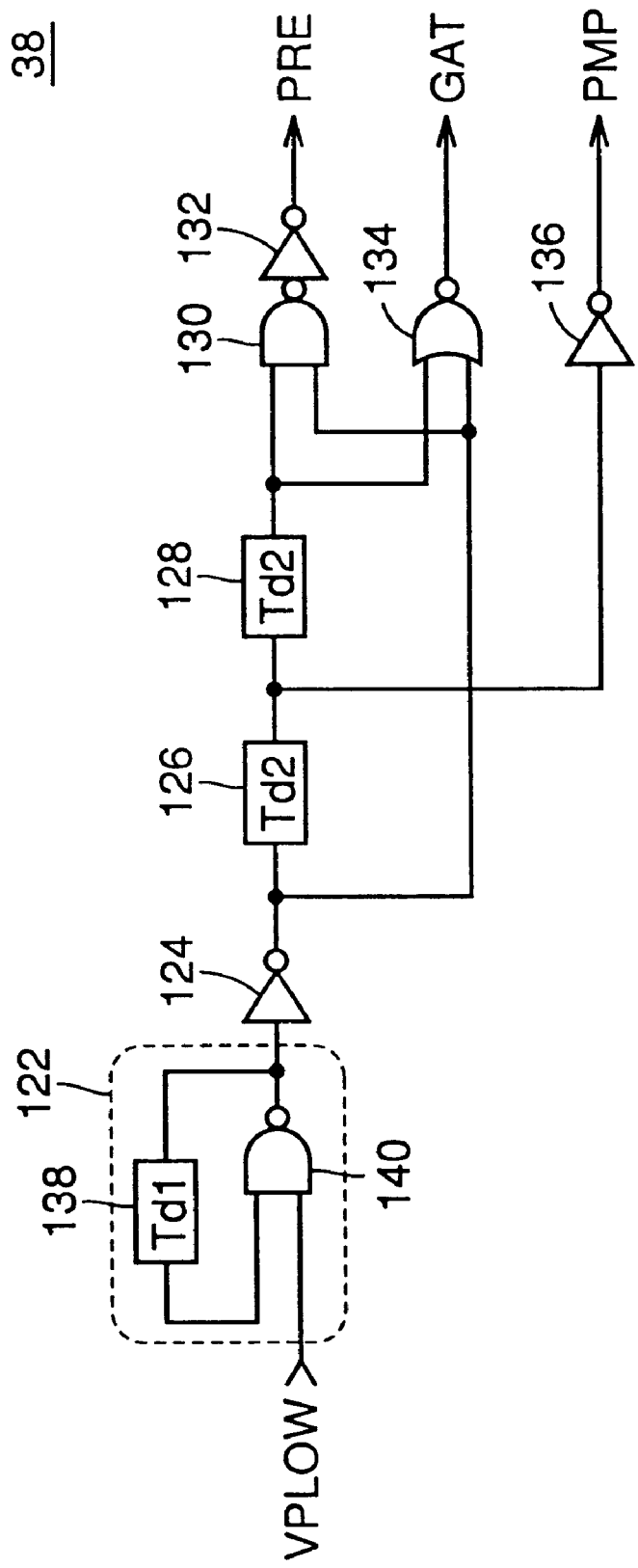
FIG. 5 is a circuit diagram showing a structure of a clock generating portion 38 in FIG. 2.

FIG. 5 is a circuit diagram showing a structure of clock generating portion 38 shown in FIG. 2.

Referring to FIG. 5, clock generating portion 38 includes a ring oscillator 122 which oscillates when activating signal VPLOW is at H-level, an inverter 124 which inverts the signal issued from ring oscillator 122, a delay circuit 126 which delays the output of inverter 124 by a delay time Td2, a delay circuit 128 which further delays the output of delay circuit 126 by delay time Td2, an NAND circuit 130 which receives the outputs of inverter 124 and delay circuit 128, an inverter 132 which receives and inverts the output of NAND circuit 130 for issuing a clock signal PRE, an NOR circuit 134 which receives the outputs of inverter 124 and delay circuit 128, and issues a clock signal GAT, and an inverter 136 which receives and inverts the output of delay circuit 126 for issuing a clock signal PMP.

Ring oscillator 122 includes an NAND circuit 140 receiving signal VPLOW on its first input, and a delay circuit 138 which receives and delays the output of NAND circuit 140 by a delay time Td1. The output of delay circuit 138 is applied to a second input of NAND circuit 140. The delay circuit can be formed of, e.g., even inverters connected in series.

Figure 6:
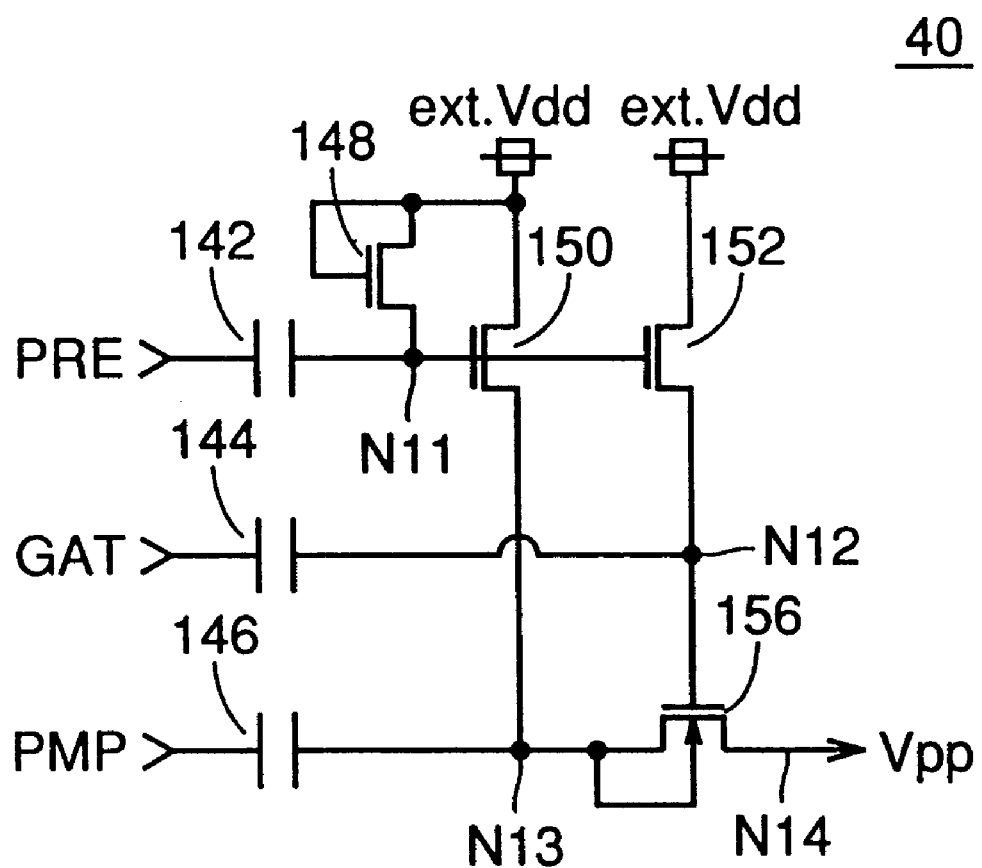
FIG. 6 is a circuit diagram showing a structure of a pump portion 40 shown in FIG. 2.

FIG. 6 is a circuit diagram showing a structure of pump portion 40 shown in FIG. 2.

Referring to FIG. 6, pump portion 40 includes a capacitor 142 which has one end receiving clock signal PRE and the other end connected to node N-11, an N-channel MOS transistor 148 which is diode-connected in a direction heading from the node supplied with external power supply potential ext.Vdd toward node N11, a capacitor 144 which has one end receiving clock signal GAT and the other end connected to a node N12, and a capacitor 146 which has one end receiving clock signal PMP and the other end connected to a node N13.

The pump portion 40 further includes an N-channel MOS transistor 150 which is connected between the node supplied with external power supply potential ext.Vdd and node N13, and has a gate connected to node N11, an N-channel MOS transistor 152 which is connected between the node supplied with external power supply potential ext.Vdd and node N12, and has a gate connected to node N11, and an N-channel MOS transistor 156 which is connected between nodes N13 and N14, and has a gate connected to node N12 and a back gate connected to node N13. Node N14 is connected to the boosted potential power supply line for supplying boosted potential Vpp to another circuit.

A potential raising operation will now be briefly described with reference to FIGS. 5 and 6. When activating signal VPLOW is activated to attain H-level, ring oscillator 122 starts oscillation with a period of Trp. In accordance with period Trp, clock generating portion 38 generates clock signals PRE, GAT and PMP controlling the pump operation. By the operation of one cycle, pump portion 40 supplies charges Qcp expressed by the following formula to the boosted potential power supply line.

$$Qcp = (2 \times ext.Vdd - Vpp) \times Cp \quad (1)$$

where Cp represents the pump capacity.

Boosted potential Vpp is high, and must be precisely controlled in view of reliability. Therefore, changes in boosted potential Vpp, which are caused by the circuit itself generating boosted potential Vpp, will now be discussed.

It is assumed that Cdp represents a decouple capacity connected to the boosted potential power supply line, i.e., Vpp trunk line, Ipp represents a current consumption received by the memory array from the boosted potential power supply line, and Tdp represents a reaction time of the Vpp level detecting circuit.

In the case where the current is consumed and a relationship of Vpp <2Vrefd is exhibited, a further lowering amount dVpp(−), by which boosted potential Vpp lowers due to delay in reaction of the Vpp level detecting circuit, is expressed by the following formula:

$$dVpp(-) = Ipp \times Tdp / Cdp \quad (2)$$

In the case where the Vpp pump circuit raises boosted potential Vpp to exhibit a relationship of Vpp >2Vrefd, an overshoot amount dVpp(+) which appears on boosted potential Vpp due to delay in reaction of the Vpp level detecting circuit is expressed by the following formula:

$$dVpp(+) = Qcp \times (Tdp/Trp) / Cdp \quad (3)$$

where (Tdp/Trp) represents the number of times which the Vpp pump operates within reaction time Tdp of the Vpp level detecting circuit. Since one Vpp pump operation supplies the charges of Qcp, the amount of charges, which are excessively supplied from the Vpp pump within the reaction time of the Vpp level detecting circuit can be expressed as "Qcp×(Tdp/Tip)". Since these charges are accumulated in decouple capacity Cdp connected to the boosted potential power supply line, the foregoing formula (3) can be derived.

Large values of dVpp(−) and dVpp(+) mean large variations in boosted potential Vpp. In particular, if dVpp(+) exceeds a certain extent, problems such as destruction of a gate oxide film of a transistor may occur. Accordingly, it is necessary to reduce the level variations of Vpp. From formulas (2) and (3), it can be understood that dVpp(−) and dVpp(+) can be reduced by reducing Tdp/Cdp. Thus, increase in reaction speed of the Vpp level detecting circuit and sufficient increase in decouple capacity are effective.

Figure 7:
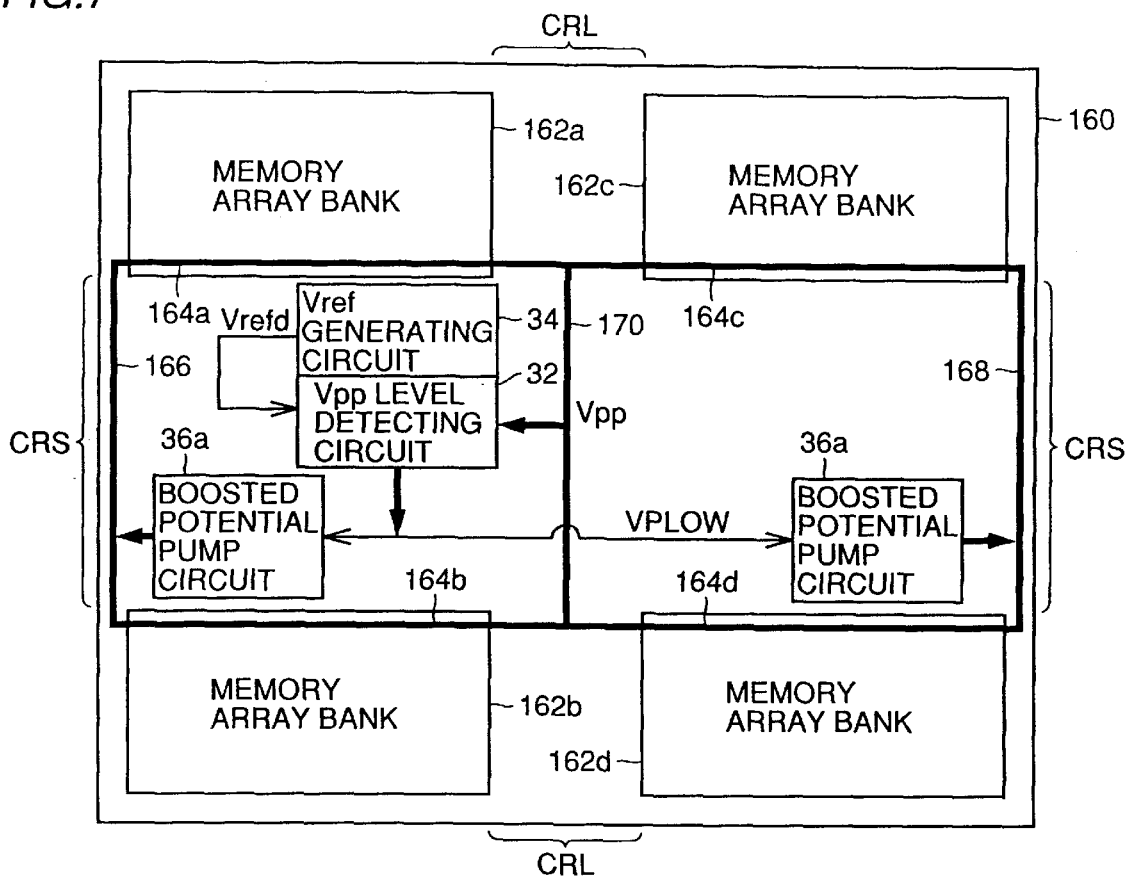
FIG. 7 shows an arrangement of circuits generating boosted potentials in the first embodiment.

FIG. 7 shows an arrangement of a circuit system generating boosted potential Vpp in the first embodiment.

Referring to FIG. 7, a semiconductor memory device 160 is formed on a rectangular main surface of a substrate. The rectangular main surface is roughly divided into three regions; an upper memory region, a central region CRS and a lower memory region. These regions are aligned in the direction along the short side of the rectangle. The central region CRS extends along a line connecting mid-points of the opposite short sides of the rectangle. The upper memory region includes memory array banks 162a and 162c. The lower memory region includes memory array banks 162b and 162d. In other words, the semiconductor memory device 160 includes the memory array banks 162a, 162b, 162c and 162d, which are arranged in two rows and two columns, and each has a rectangular form. Vref generating circuit 34, Vpp level detecting circuit 32 and boosted potential pump circuits 36a and 36b are arranged in central region CRS.

Along the outer peripheral portion of central region CRS, there is arranged the boosted potential power supply line for supplying boosted potential Vpp to the respective memory array banks. The boosted potential power supply line is the Vpp trunk line for supplying the boosted potential to the word drivers and others arranged in the respective memory array banks.

This Vpp trunk line includes portions 164a, 164b, 164c and 164d extending along the sides of memory array banks 162a, 162b, 162c and 162d which are in contact with central region CRS, respectively, a portion 166 which is arranged along one short side of the chip for receiving the current supplied from raised pump circuit 36a, and a portion 168 which is arranged along the other side of the chip for receiving the current supplied from raised pump circuit 36b.

An end of portion 166 is connected to an end of portion 164a, and the other end of portion 166 is connected to an end of portion 164b. An end of portion 168 is connected to an end of portion 164c, and the other end of portion 168 is connected to an end of portion 164d. The Vpp trunk line includes a portion 170 which connects the other ends of portions 164a and 164c together, and is connected to Vpp level detecting circuit 32 arranged in a substantially central position of the chip. Portion 170 also connects the other ends of portions 164b and 164d together, and is connected to Vpp level detecting circuit 32.

Thus, Vpp level detecting circuit 32 is connected to the substantially central position of the Vpp trunk line, which extends longitudinally through the center of the chip, and connects the mid-point of a linear portion containing portions 164a and 164c to the mid-point of a linear portion containing portions 164b and 164d. This central position is spaced most equally from memory array banks 162a, 162b, 162c and 162d, i.e., the portions or positions where currents are consumed from the boosted potential power supply line.

In FIG. 7, memory array banks 162a, 162b, 162c and 162d operate independently of each other, and are mutually connected via the Vpp trunk line. When a certain bank operates in the multi-bank structure wherein the Vpp trunk line is commonly used, parasitic capacities of the other banks are connected to the Vpp trunk line in addition to the decouple capacity of the whole chip so that the decouple capacity becomes larger than that in the case where the Vpp trunk line is not commonly used. Thereby, the charges are supplied to the bank which is actually operating.

Accordingly, the trunk line is commonly used in many cases because this facilitates arrangement and control of the Vpp pump circuit.

Figure 20:
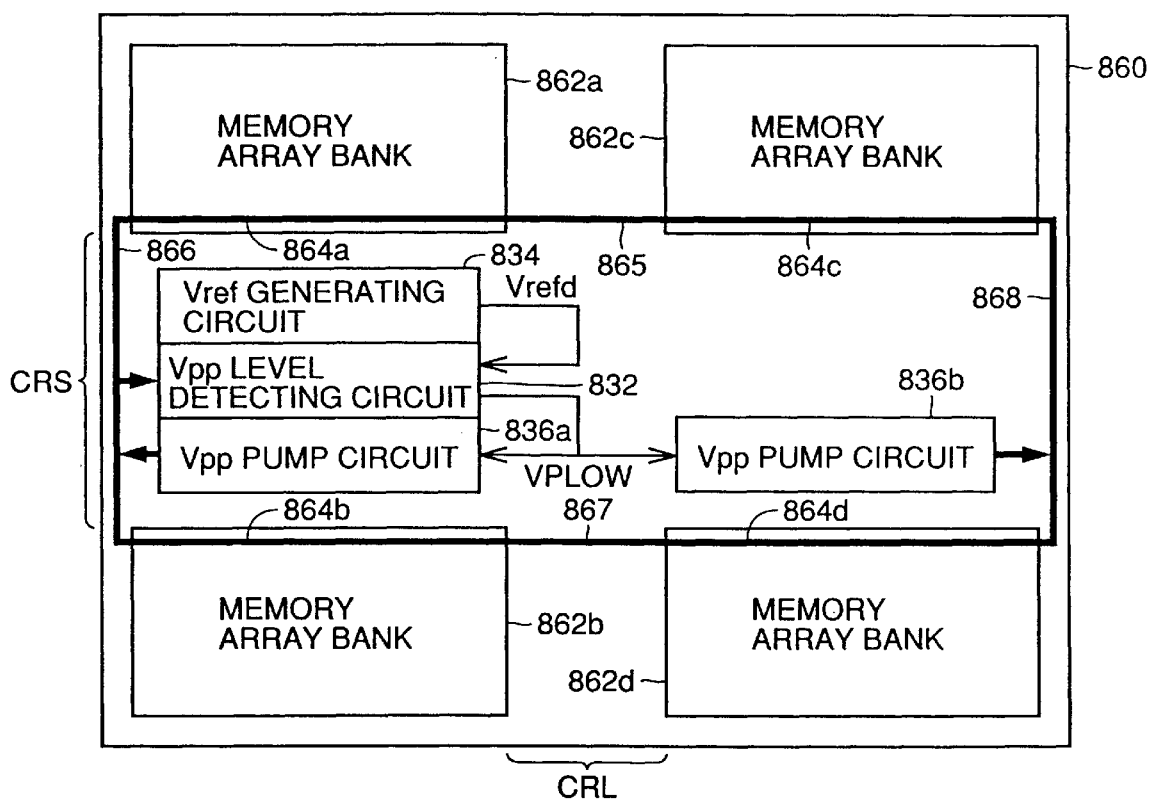
FIG. 20 shows a typical example of an arrangement of a boosted potential generating circuit system and a boosted potential power supply line in the prior art.
Figure 21:
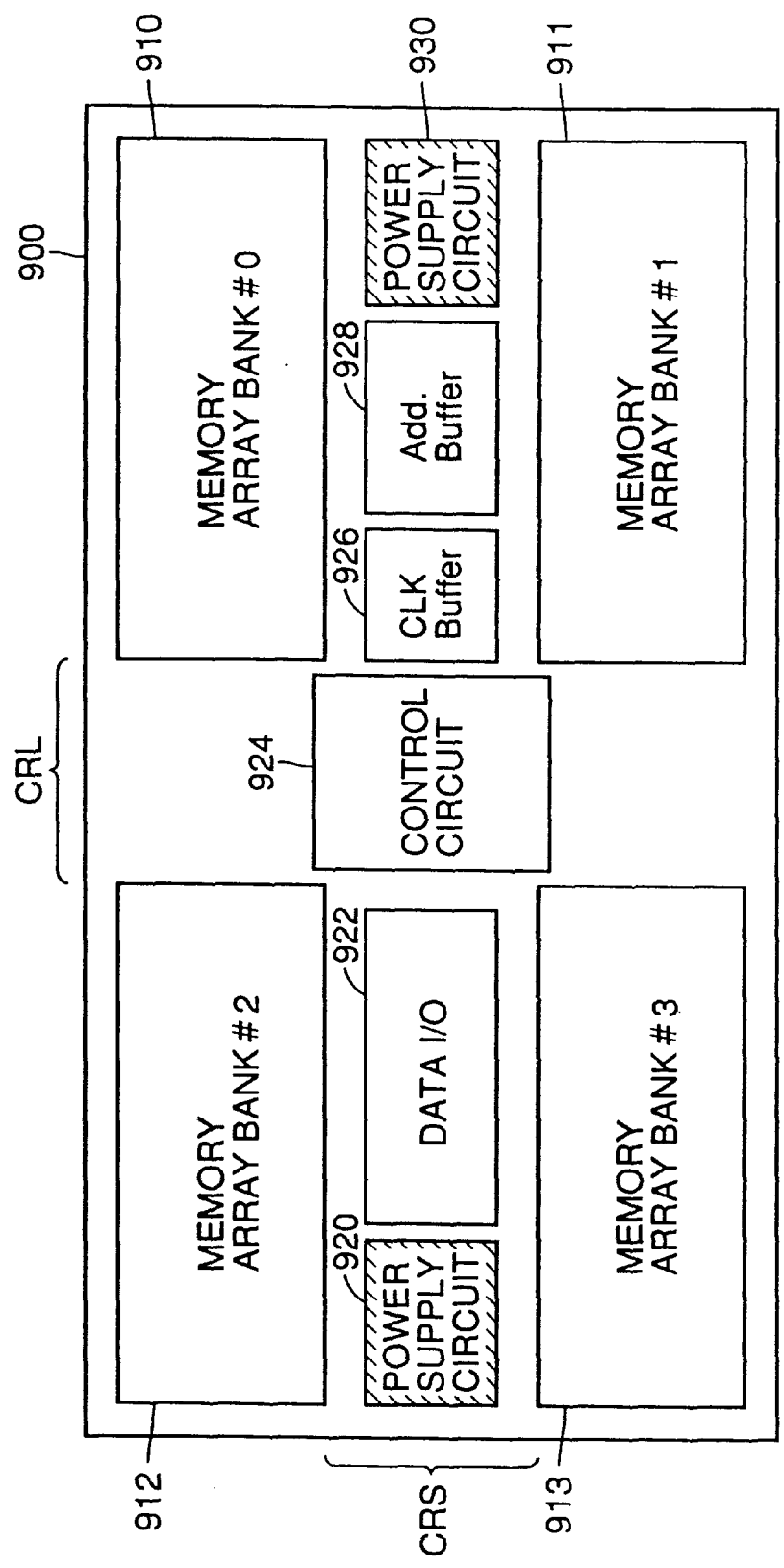
FIG. 21 shows an example of a layout of a power supply circuit in the prior art.

In the above structure, the Vpp trunk line is provided with portion 170 connected at its substantially central portion to Vpp level detecting circuit 32, and this has the following advantage over the prior art shown in FIG. 20.

In FIG. 20, a distance from the point at which Vpp level detecting circuit 832 detects the potential level of the Vpp trunk line to the remotest consuming portions, i.e., sides of memory array banks 862c and 862d neighboring to the short side of the chip, is approximately twice as large as that in the structure shown in FIG. 7. This is true also with respect to the largest distance to the boosted potential pump circuit supplying the current to the Vpp trunk line.

Accordingly, the interconnection delay, which occurs in FIG. 20 due to the Vpp trunk line and various capacities parasitic to it, is four times larger than that in the structure shown in FIG. 7. In the case shown in FIG. 20, Vpp level detecting circuit 832 cannot accurately detect variations in boosted potential due to the interconnection delay so that the width of variation in boosted potential is large.

In FIG. 7, portion 170 is formed in central region CRL extending along the line, which connects the mid-points of the long sides of the chip, so that portions connecting the Vpp trunk lines with each other are larger in number than those in FIG. 20. As a result, connection between the banks is enhanced, and the distribution of boosted potential Vpp can be further uniform.

In FIG. 7, the four banks are arranged as independent blocks, which are disposed in two rows and two columns. In a structure including more banks, two or more banks may be included in one memory block. In the case of, e.g., eight-bank structure, the banks may be grouped into four memory blocks each including two banks, and these memory blocks may be arranged in two rows and two columns similarly to the arrangement in FIG. 7.

In semiconductor memory device 1 of the first embodiment, as described above, all the banks of the multi-bank structure are mutually connected via the signal Vpp trunk line, and particularly, the Vpp level detecting circuit is arranged in the position spaced equally from the respective banks. Thereby, boosted potential Vpp can be detected and controlled more accurately.

MODIFICATION OF THE FIRST EMBODIMENT

The first embodiment can be applied to a circuit system for generating an internal potential within the semiconductor memory device other than boosted potential Vpp.

The internal potential other than boosted potential Vpp may be, e.g., an internal power supply potential Vdd generated by a voltage drop circuit VDC and a negative potential Vneg used in a negative word line structure. Description will be given on a circuit generating negative potential Vneg.

The reason why the negative word line structure is used is as follows. For writing a potential Vdh at H-level on the bit line into the memory cell in a DRAM, a drive potential of the word line must be determined in view of a threshold voltage Vta of an access transistor.

The potential across the gate and source of the access transistor must be equal to or higher than (Vdh+Vta), and therefore must be higher than external power supply potential ext.Vdd in general cases. Therefore, boosted potential Vpp is required. For reducing a time required for reading data from the memory cells, it is desired to increase boosted potential Vpp. However, it can be increased only to a limited extent in view of reliability of a gate oxide film of the access transistor. This is because the transistors have been miniaturized to a higher extent, and there is an increasing tendency to reduce a gate oxide film thickness Tox.

In view of the above, the threshold voltage of the access transistor may be lowered. Although the lowered threshold voltage is advantageous in the operations during reading and writing, a leak current is liable to flow via the access transistor, which is to be off, when the memory cell is in the unselected state. When the leak current increases, the charges which correspond to held data and are accumulated in the memory cell are lost in a short time.

For the above reasons, the potential on the unselected word line is set to negative potential Vneg instead of the ground potential used in the prior art so that the leak current of the access transistor may be suppressed. This structure is the "negative word line structure". When the access transistor is off, since the leak current depends on the gate-source potential Vgs of the access transistor, the leak current can be suppressed to a higher extent as the potential on the gate and therefore the potential on the word line are lowered.

By determining the potential (at L-level) on the word line in the unselected state to the negative potential, leakage can be suppressed even if the threshold voltage Vta of the access transistor is low. By lowering the threshold voltage Vta, it becomes unnecessary to increase the potential (at H-level) on the word line in the selected state and therefore boosted potential Vpp to a large extent.

Figure 8:
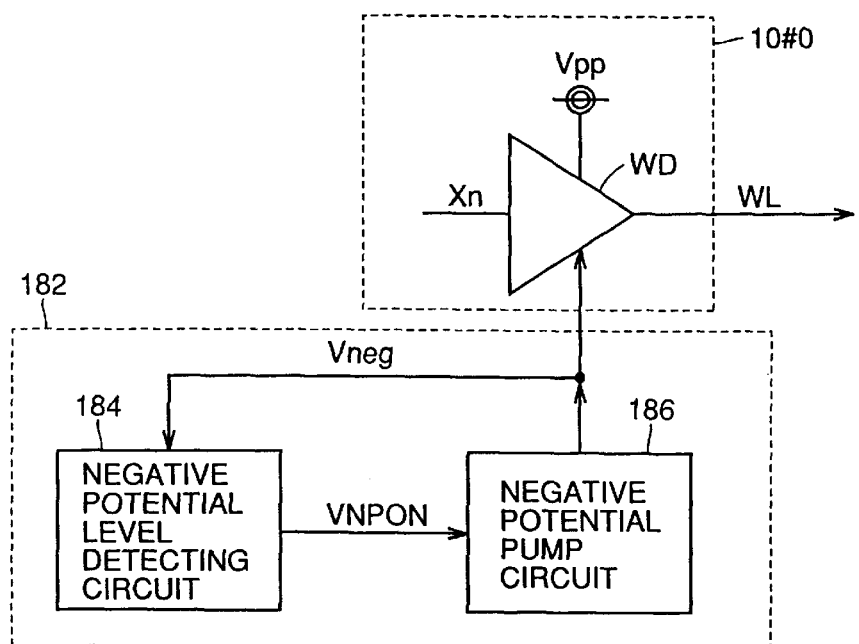
FIG. 8 is a block diagram showing a structure of a negative potential generating circuit 182.

FIG. 8 is a block diagram showing a structure of a negative potential generating circuit 182.

Referring to FIG. 8, negative potential generating circuit 182 includes a negative potential level detecting circuit 184 which monitors negative potential Vneg, and activates an activating signal VNPON when negative potential Vneg is not sufficiently low, and a negative potential pump circuit 186 which further lowers negative potential Vneg in accordance with activation of activating signal VNPON. Negative potential Vneg is the potential which sets the output of word driver WD to L-level.

Figure 9:
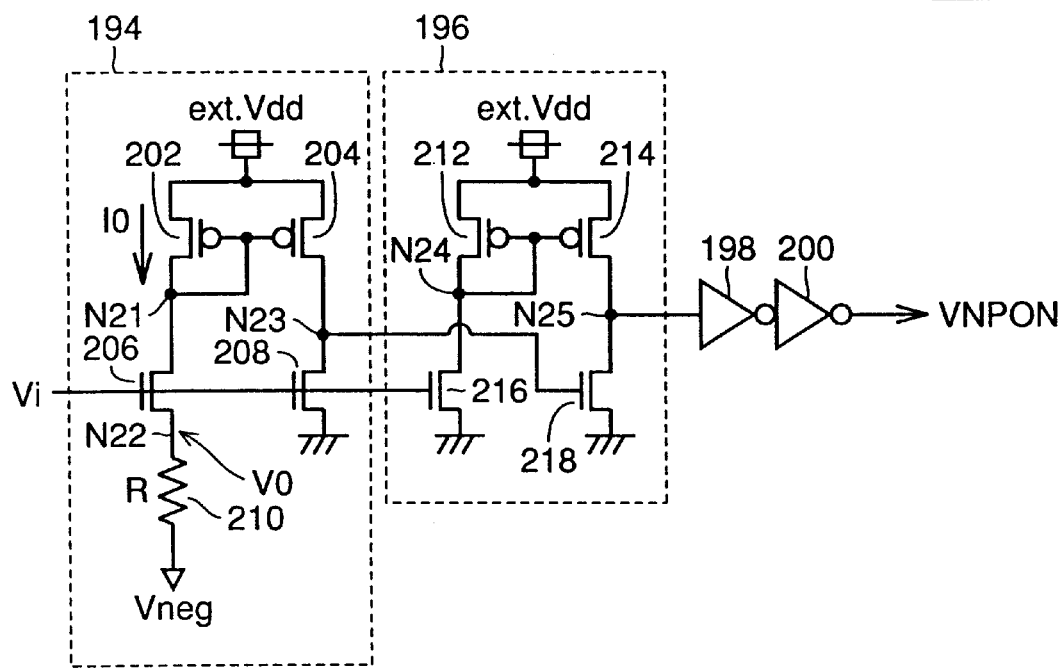
FIG. 9 is a circuit diagram showing a structure of a negative potential level detecting circuit 184 in FIG. 8.

FIG. 9 is a circuit diagram showing a structure of negative potential level detecting circuit 184 in FIG. 8.

Referring to FIG. 9, negative potential level detecting circuit 184 includes a detecting portion 194 which detects whether negative potential Vneg is equal to the desired potential or not, an amplifier portion 196 amplifying the output of detector 194, and inverters 198 and 200 which receive the output of amplifier portion 196, and are connected in series for issuing signal VNPON activating the pump.

Detecting portion 194 includes a P-channel MOS transistor 202 which has a source coupled to external power supply potential ext.Vdd as well as a drain and a gate connected to a node N21, a P-channel MOS transistor 204 which has a source coupled to external power supply potential ext.Vdd, a drain connected to a node N23 and a gate connected to node N21, an N-channel MOS transistor 206 which is connected between nodes N21 and N22, and has a gate supplied with a potential Vi, an N-channel MOS transistor 208 which is connected between node N23 and the ground node, and has a gate supplied with potential Vi, and a resistance 210 which is connected between node N22 and a node supplied with negative potential Vneg.

Amplifier portion 196 includes a P-channel MOS transistor 212 which has a source coupled to external power supply potential ext.Vdd as well as a drain and a gate connected to a node N24, a P-channel MOS transistor 214 which has a source coupled to external power supply potential ext.Vdd, a drain connected to a node N25 and a gate connected to node N24, an N-channel MOS transistor 216 which is connected between node N24 and the ground node, and has a gate supplied with potential Vi, and an N-channel MOS transistor 218 which is connected between node N25 and the ground node, and has a gate connected to node N23. Node N25 is the output node of amplifier portion 196, and is connected to the input of inverter 198.

Negative potential level detecting circuit 184 activates signal VNPON when the following formula is established:

$$|Nneg| < R \times I1(Vi) \quad (4)$$

where I0(Vi) is a value of current which flows through the resistance when potential V0 on node N22 is equal to the ground potential, and depends on potential Vi. When signal VNPON activates negative pump circuit 186, negative potential Vneg is further lowered. When it is sufficiently low, the relationship of the formula (4) is not established so that negative potential pump circuit 186 is deactivated.

Figure 10:
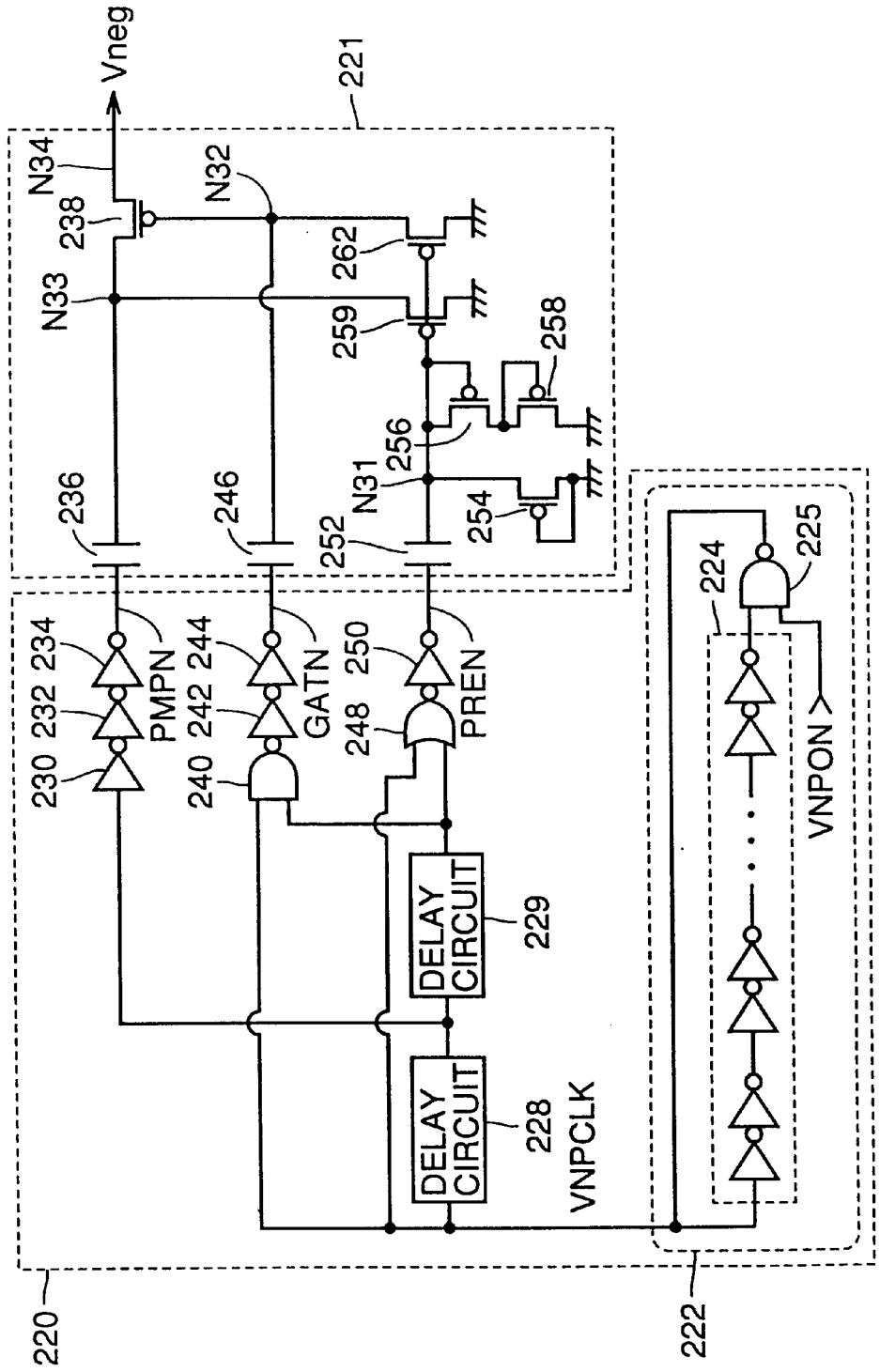
FIG. 10 is a circuit diagram showing a structure of a negative potential pump suit 186 shown in FIG. 8.

FIG. 10 is a circuit diagram showing a structure of negative potential pump circuit 186 in FIG. 8.

Referring to FIG. 10, negative potential generating circuit 186 includes a clock generating portion 220 which is activated by activating signal VNPON to generate clock signals PREN, GATN and PMPN, and a pump portion 221 which generates the negative potential in accordance with clock signals PREN, GATN and PMPN.

Clock generating portion 220 includes a ring oscillator 222 which oscillates when activating signal VNPON is at H-level, a delay circuit 228 which delays a clock signal VNPCLK issued from ring oscillator 222, a delay circuit 229 which further delays the output of delay circuit 228, an NOR circuit 248 which receives clock signal VNPCLK and the output of delay circuit 229, an inverter 250 which receives and inverts the output of NOR circuit 248 to issue clock signal PREN, an NAND circuit 240 which receives clock signal VNPCLK and the output of delay circuit 229, inverters 242 and 244 which are connected in series for receiving the output of NAND circuit 240 and issuing clock signal GATN, and inverters 230, 232 and 234 which are connected in series for receiving and inverting the output of delay circuit 228 to issue clock signal PMPN.

Ring oscillator 222 includes an NAND circuit 225 which receives signal VNPON on its first input, and a delay circuit 224 which receives and delays the output of NAND circuit 225. The output of delay circuit 224 is applied to a second input of NAND circuit 225. Delay circuit 224 is formed of, e.g., even stages of inverters connected in series.

Pump portion 221 includes a capacitor 252 which has one end receiving clock signal PREN and the other end connected to a node N31, a P-channel MOS transistor 254 which is diode-connected in a direction heading from node N31 toward the ground node, P-channel MOS transistors 258 and 256 which are diode-connected in series in a direction heading from the ground node toward node N31, a capacitor 246 which has one end receiving clock signal GATN and the other end connected to a node N32, and a capacitor 236 which has one end receiving clock signal PMPN and the other end connected to a node N33.

Pump portion 40 further includes a P-channel MOS transistor 259 which is connected between the ground node and node N33, and has a gate connected to node N31, a P-channel MOS transistor 262 connected between the ground node and node N32, and has a gate connected to node N31, and a P-channel MOS transistor 238 which is connected between nodes N33 and N34, and has a gate connected to node N32. Node N34 is connected to the negative potential power supply line for supplying negative potential Vneg to another circuit.

Figure 11:
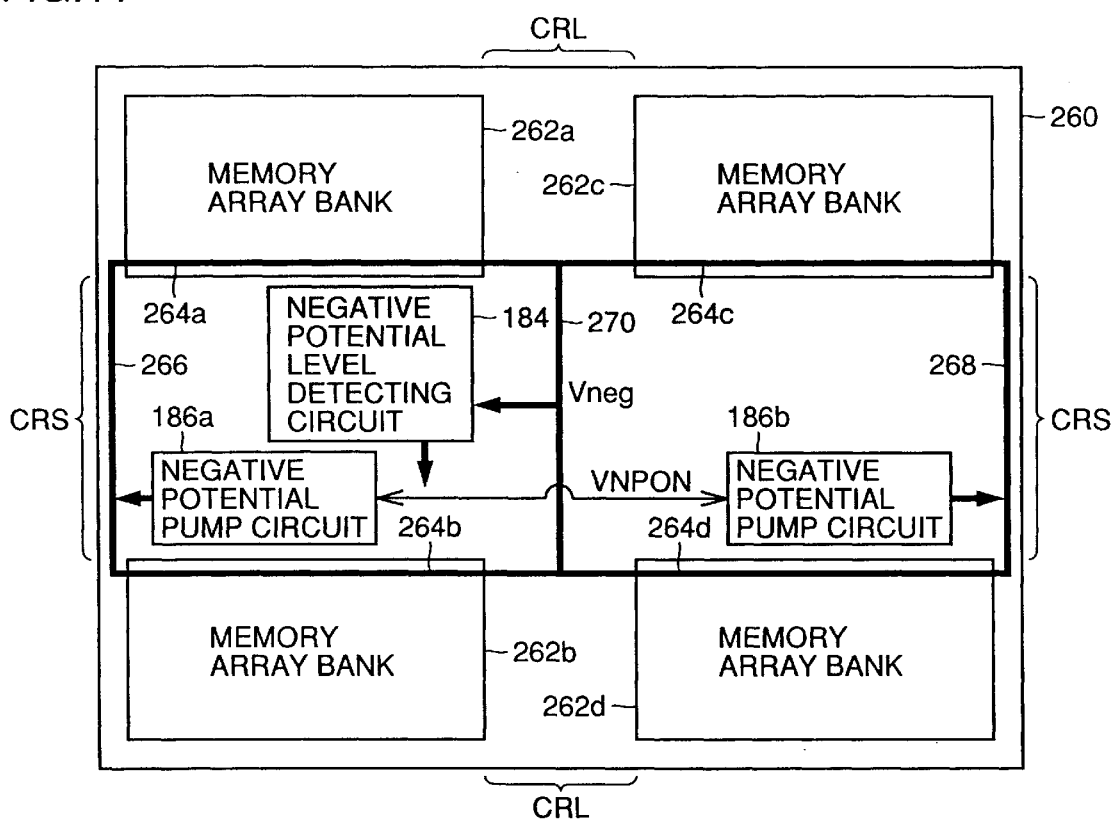
FIG. 11 shows an arrangement of circuits generating negative potentials in the first embodiment.

FIG. 11 shows an arrangement of a circuit system generating the negative potential in the first embodiment.

Referring to FIG. 11, a semiconductor memory device 260 has a rectangular substrate. Semiconductor memory device 260 includes memory array banks 262a, 262b, 262c and 262d, which are arranged in two rows and two columns, and each have a rectangular form.

Central region CRS extends along a line connecting mid-points of the opposite short sides of the chip, and contains a region between memory array banks 262a and 262b as well as a region between memory array banks 262c and 262d. Negative potential level detecting circuit 184 and negative potential pump circuit 186a and 186b are arranged in central region CRS.

The negative potential power supply line for supplying the negative potential from negative potential pump circuits 186a and 186b to the respective memory banks has portions 264a–264d, 266, 268 and 270.

These portions are arranged in a manner similar to that of portions 164a–164d, 166, 168 and 170 of the boosted potential power supply line in FIG. 7, and therefore will not be discussed.

In the modification of the first embodiment, all the banks of the multi-bank structure are mutually connected via the power supply trunk line supplying negative potential Vneg, similarly to the case of boosted potential Vpp. In this structure, the negative potential level detecting circuit is arranged in the position spaced equally from the respective banks. Thereby, negative potential Vneg can be detected and controlled more accurately according to the modification.

In the first embodiment and the modification, all the banks of the multi-bank structure are mutually connected by the single power supply line transmitting the internally generated power supply potential. According to the first embodiment and the modification, the detecting circuit for detecting the internally generated power supply potential is arranged in the position equally spaced from the respective banks.

Also, the position at which the detecting circuit detects the potential of the trunk line is equally spaced from all banks. Thereby, the internally generated power supply potential can be detected and controlled more accurately in the above structure.

SECOND EMBODIMENT

The first embodiment has been described in connection with the arrangement of the Vpp level detecting circuit in the multi-bank structure provided with the commonly used Vpp trunk line. Alternatively, a plurality of Vpp trunk lines which are not mutually connected may be present.

Figure 12:
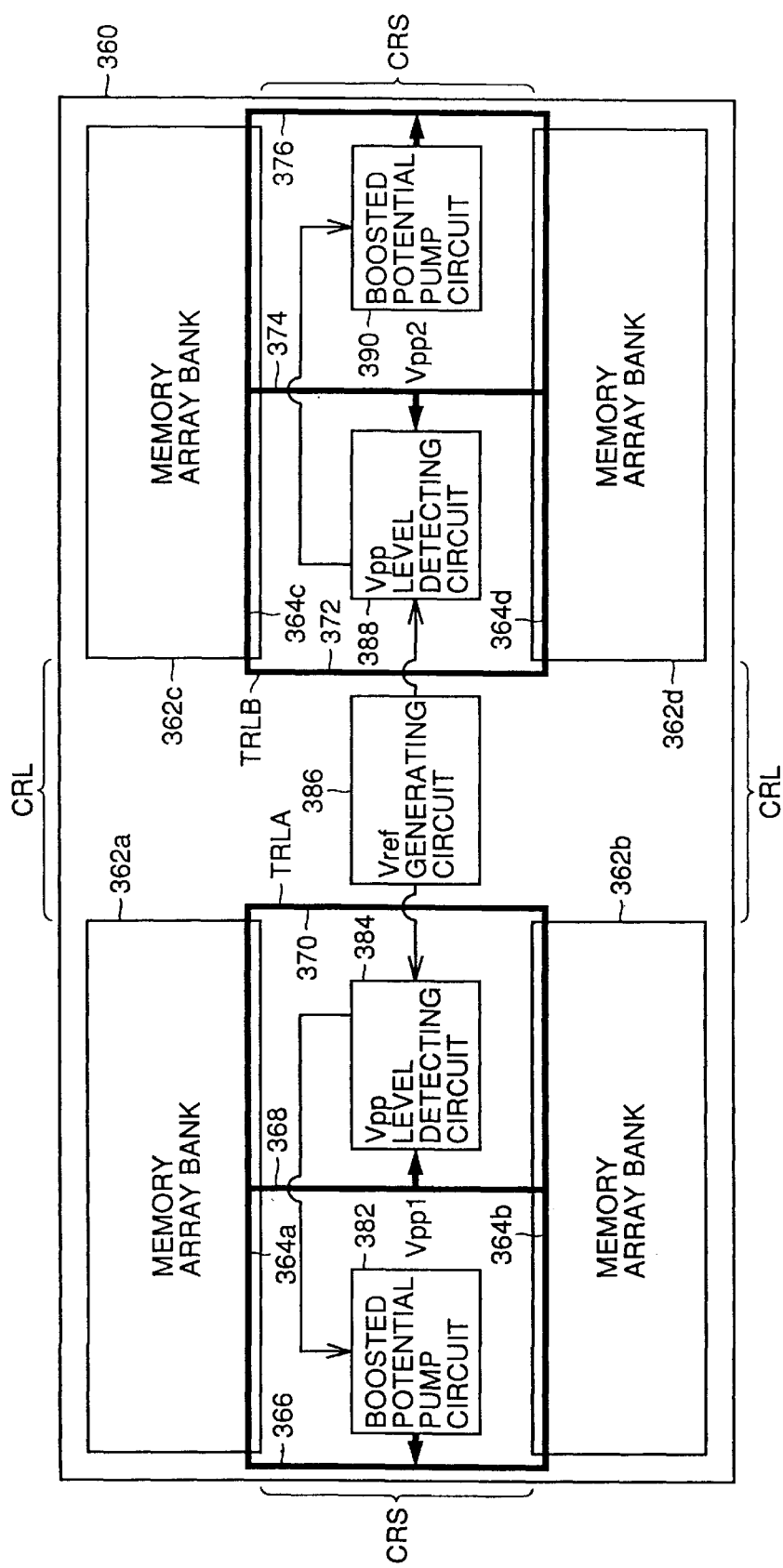
FIG. 12 shows a structure including a plurality of Vpp trunk lines which are not connected mutually, and particularly shows an arrangement of the Vpp trunk lines.

FIG. 12 shows an arrangement of a plurality of Vpp trunk lines which are not mutually connected.

Referring to FIG. 12, a semiconductor memory device 360 has a rectangular substrate. Semiconductor memory device 360 includes memory array banks 362a, 362b, 362c and 362d, which are arranged in two rows and two columns, and each have a rectangular form.

Central region CRS extends along a line connecting mid-points of the opposite short sides of the chip, and contains a region between memory array banks 362a and 362b as well as a region between memory array banks 362c and 362d. Vref generating circuit 386, Vpp level detecting circuit 388 and 384, boosted potential pump circuits 382 and 390 are arranged in central region CRS.

A Vpp trunk line TRLA provided corresponding to memory array blocks 362a and 362b is isolated from a Vpp trunk line TRLB provided corresponding to memory array banks 362c and 362d so that the potentials thereon may be controlled independently of each other. A Vref generating circuit 386 is provided commonly to Vpp trunk lines TRLA and TRILB, and is disposed in a central region of the chip.

Vpp trunk line TRLA includes portions 364a and 364b extending along the sides of memory array banks 362a and 362b which are in contact with central region CRS, respectively. Vpp trunk line TRLA further includes portions 366 and 370 which connect the opposite ends of portion 364a to the opposite ends of portion 364b, respectively, and a portion 368 connecting the mid-points of portions 364a and 364b together.

Boosted potential pump circuit 382 supplies charges to a middle portion of portion 366.

Vpp level detecting circuit 384 monitors a potential Vpp 1 on the middle portion of portion 368, and boosted potential pump circuit 382 is driven in accordance with the result of monitoring. The monitoring of potential Vpp 1 on the middle portion of portion 368 is desired similarly to the first embodiment, because this monitoring is performed on the portion equally spaced from memory array banks 362a and 362b, which are the load circuits connected to Vpp trunk line TRLA.

Vpp trunk line TRLB includes portions 364c and 364d extending along the sides of memory array banks 362c and 362d which are in contact with central region CRS, respectively. Vpp trunk line TRLB further includes portions 372 and 376 which connect the opposite ends of portion 364c to the opposite ends of portion 364d, respectively, and a portion 374 connecting the mid-points of portions 364c and 364d together.

Boosted potential pump circuit 390 supplies charges to a middle portion of portion 376.

Vpp level detecting circuit 388 monitors a potential Vpp2 on the middle portion of portion 374, and boosted potential pump circuit 390 is driven in accordance with the result of monitoring. The monitoring of potential Vpp2 on the middle portion of portion 374 is desired similarly to the first embodiment, because this monitoring is performed on the portion equally spaced from memory array banks 362c and 362d, which are the load circuits connected to Vpp trunk line TRLB.

In the case where the plurality of independent Vpp trunk lines are present in the multi-bank structure, the Vpp level detecting circuits are arranged for the respective Vpp trunk lines such that each Vpp level detecting circuit is equally spaced from the corresponding banks, whereby boosted potential Vpp can be detected and controlled more accurately, as already described with reference to the second embodiment.

THIRD EMBODIMENT

Even in the structure provided with a plurality of Vpp trunk lines which are not connected together, the Vpp level detecting circuit may be commonly used.

Figure 13:
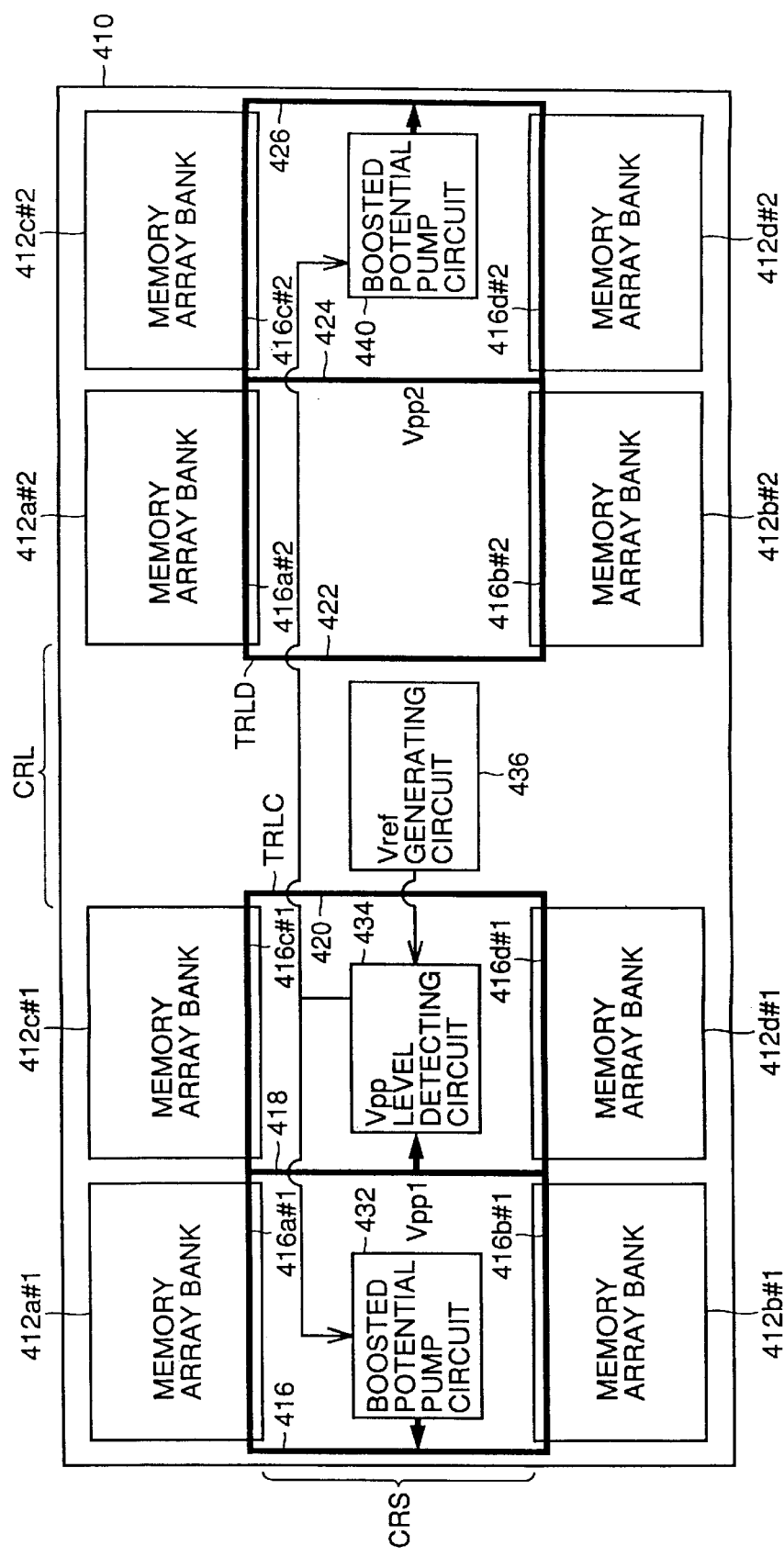
FIG. 13 shows an arrangement of a Vpp detecting circuit which is commonly used.

FIG. 13 shows an arrangement of a Vpp level detecting circuit which is commonly used.

Referring to FIG. 13, a semiconductor memory device 410 includes two Vpp trunk lines TRLC and TRLD which are independent of each other. However, each of four memory array banks 412a–412d is divided into two. Vpp trunk line TRLC is connected to corresponding divided sub-banks 412a#1–412d#1 of the respective banks, and Vpp trunk line TRLD is connected to corresponding divided sub-banks 412a#2–412d#2 of the respective banks.

For fast data transmission between the data terminals and the memory array banks, such a structure may be employed that sub-banks 412a#1–412d#1 are arranged near data I/O terminals DQ0–DQ7, and sub-banks 412a#2–412d#2 are arranged near data I/O terminals DQ8–DQ15.

The divided sub-banks of the same bank are simultaneously activated. Thus, activation of memory array bank 412a results in the simultaneous activation of sub-banks 412a#1 and 412a#2. Therefore, it can be considered that variations in potential on Vpp trunk line TRLC is substantially equal to those on Vpp trunk line TRLD. More specifically, control circuit and mode register 8 in FIG. 1 perform the control to activate simultaneously the divided sub-banks. Accordingly, monitoring of the potential on only one of Vpp trunk lines TRLC and TRLD is enough for the potential control.

Accordingly, a Vpp level detecting circuit 434 is provided only for Vpp trunk line TRLC. In this case, Vpp trunk line TRLC is provided with a portion 418 for achieving an equal arrangement with respect to the load circuits. Vpp detecting level circuit 434 monitors potential Vpp 1 on the middle portion of portion 418.

Although Vpp trunk line TRLD is not provided with the Vpp level detecting circuit, it is provided with a portion 424 corresponding to portion 418 for achieving potential variations equal to those on Vpp trunk line TRLC. By employing the same configuration as Vpp trunk line TRLC as described above, the potential variations on Vpp trunk line TRLD can be equal to those on Vpp trunk line TRLC, and also the trunk lines can be strength.

Based on the result detected by the Vpp level detecting circuit, boosted potential pump circuits 432 and 440 are controlled. According to this control, potential Vpp2 on Vpp trunk line TRLD can likewise be stable similarly to potential Vpp1.

In FIG. 13, each of the four banks is divided into two sub-banks, and two sub-banks are arranged as one memory block. Each Vpp trunk line shown in FIG. 13 is provided corresponding to the memory blocks arranged in two rows and two columns. Even in the case where one bank is divided into more than two sub-banks, a plurality of Vpp trunk lines may be provided so that they equally include the sub-banks of the respect banks, whereby the whole control can be performed by monitoring the potential on one of the Vpp trunk lines by the level detecting circuit.

As described above, in the case where the multi-bank structure is provided with the plurality of Vpp trunk lines, which are independent of each other, and the loads of these Vpp trunk lines equally consume the current, such a typical structure may be employed that the Vpp level detecting circuit is provided only for one of the Vpp trunk lines. The point where the current consumption can be monitored most equally on the Vpp trunk line is selected as the position where the Vpp level detecting circuit monitors the potential. Thereby, boosted potential Vpp can be detected and controlled more accurately as the whole chip. Further, the Vpp level detecting circuits can be reduced in number so that increase in chip area can be suppressed.

FOURTH EMBODIMENT

The first to third embodiments have been described in connection with the arrangement of the Vpp level detecting circuit. However, the arrangement of the boosted potential pump is also an important factor for stabilizing boosted potential Vpp.

Figure 14:
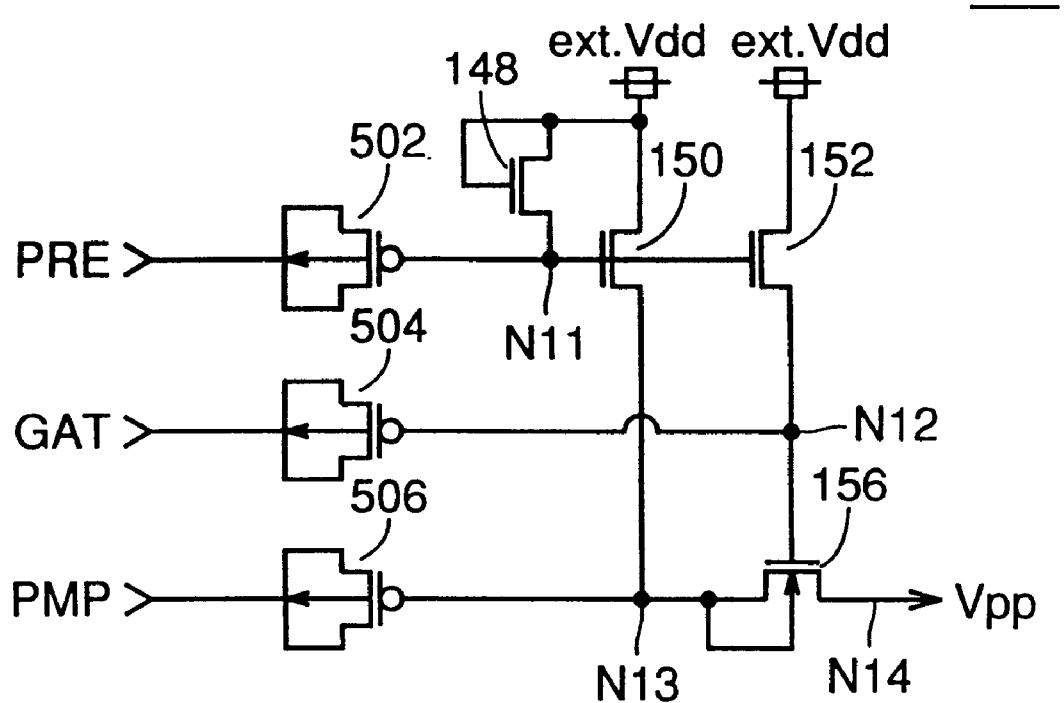
FIG. 14 is a circuit diagram showing a structure of a boosted potential pump portion 500 used in a fourth embodiment.

FIG. 14 is a circuit diagram showing a structure of a boosted potential pump portion 500 used in the fourth embodiment.

Referring to FIG. 14, pump portion 500 differs from pump portion 400 which is employed in the first embodiment and is shown in FIG. 6, in that capacitors 142, 144 and 146 are formed of PMOS capacitors 502, 504 and 506, respectively. The PMOS capacitor is such a capacitor that uses a gate oxide film of a P-channel MOS transistor. Structures other than the above are the same as those of pump portion 40 shown in FIG. 6, and therefore description will not be repeated here.

In each of PMOS capacitors 502, 504 and 506, the source, drain and well are electrically connected together, and therefore carry the same potential. The relationship between potentials on the respective nodes will now be discussed, taking PMOS capacitor 506 in the figure as an example.

In the precharge operation, external power supply potential ext.Vdd is placed on node N13, and the level of clock signal PMP is set to the ground potential. PMOS capacitor 506 has accumulated charges which were supplied in an accumulation mode.

When the pump operation starts, node N13 is isolated from external power supply potential ext.Vdd, and the level of clock signal PMP is set to external power supply potential ext.Vdd. Thereby, the potential on node N13 goes to (2×ext.Vdd). Even when N-channel MOS transistor 156 is off, the charges accumulated on node N13 start to be sent from the well portion of N-channel MOS transistor 156 to node N14.

Thereafter, N-channel MOS transistor 156 is turned on so that the charges are sufficiently supplied to node N14. The quantity Qcp of charges which are supplied by performing the above operation one time is equal to (2×ext.Vdd−Vpp)× Cp, where Cp is the capacity value of PMOS capacitor 506.

When the current is consumed in the negative circuit, the charges of the quantity Qcp must be supplied smoothly to the Vpp trunk line. Accordingly, it is desirable that pump portion 500 is arranged near the memory arrays, and is located in the position equal to the plurality of memory arrays.

Therefore, pump portion 500 is arranged in an interconnection region near the memory array, and particularly is buried under a data bus region.

Figure 15:
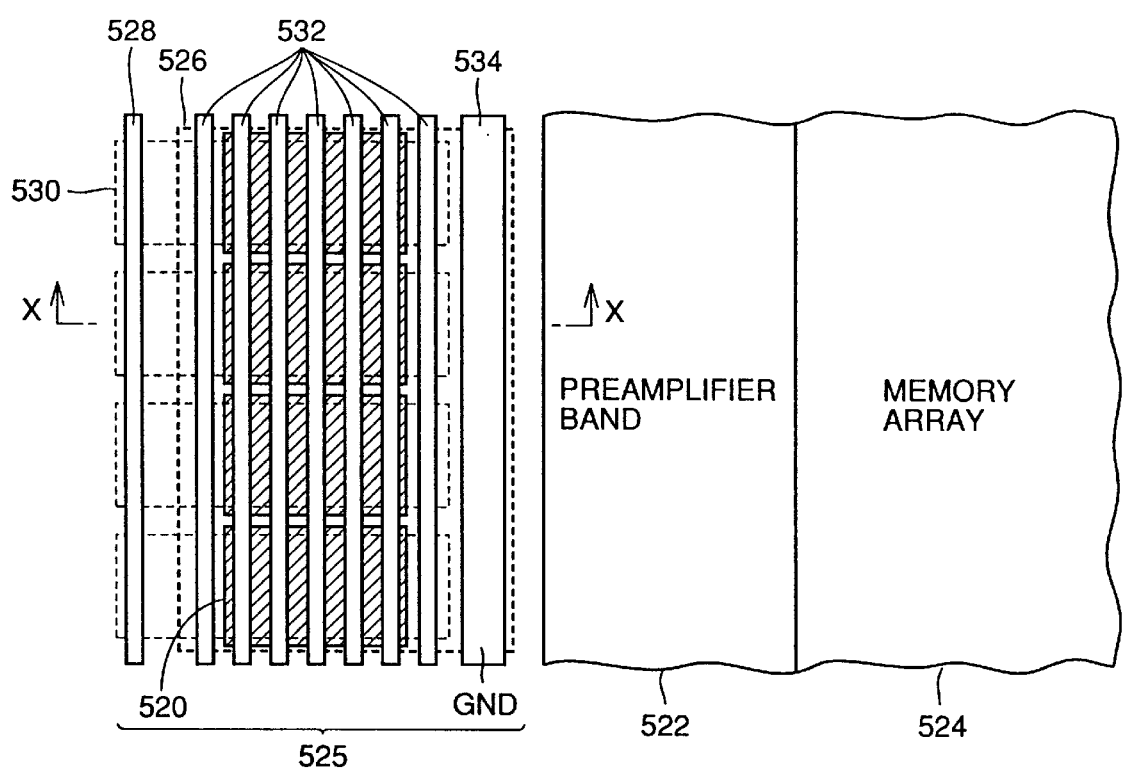
FIG. 15 is a plan of an arrangement of the pump portion.

FIG. 15 is a plan showing an arrangement of the pump portion.

Referring to FIG. 15, a preamplifier band 522 is provided in contact with a memory array 524, and an interconnection region which data lines and signal lines extend along each other is present on the side of preamplifier band 522 remote from memory array 524. However, the fifth embodiment of the invention is not restrictedly applied to the above arrangement. The above is a typical example of the arrangement where an empty area not carrying an element is somewhat likely to be left under the interconnection region.

Although not shown, the data is sent from the local data line on memory array 524 to preamplifier band 522. Preamplifier band 522 issues the amplified data onto the global data line arranged in interconnection region 525. The global data line is included in interconnections 532.

The pump portion is arranged under interconnections 532. Under interconnections 532 formed of a second metal interconnection layer, there is formed a shield 526 which is formed of a first metal layer and is fixed to the ground potential.

The capacitor of the pump portion is arranged under shield 526. An interconnection 528 supplied with signal PMP is connected to a second polycrystalline silicon layer 530 which is provided for forming the pump portion and the capacitor. For lowering the potential on shield 526 to the ground potential, a ground power supply line 534 is arranged along interconnection 532.

Figure 16:
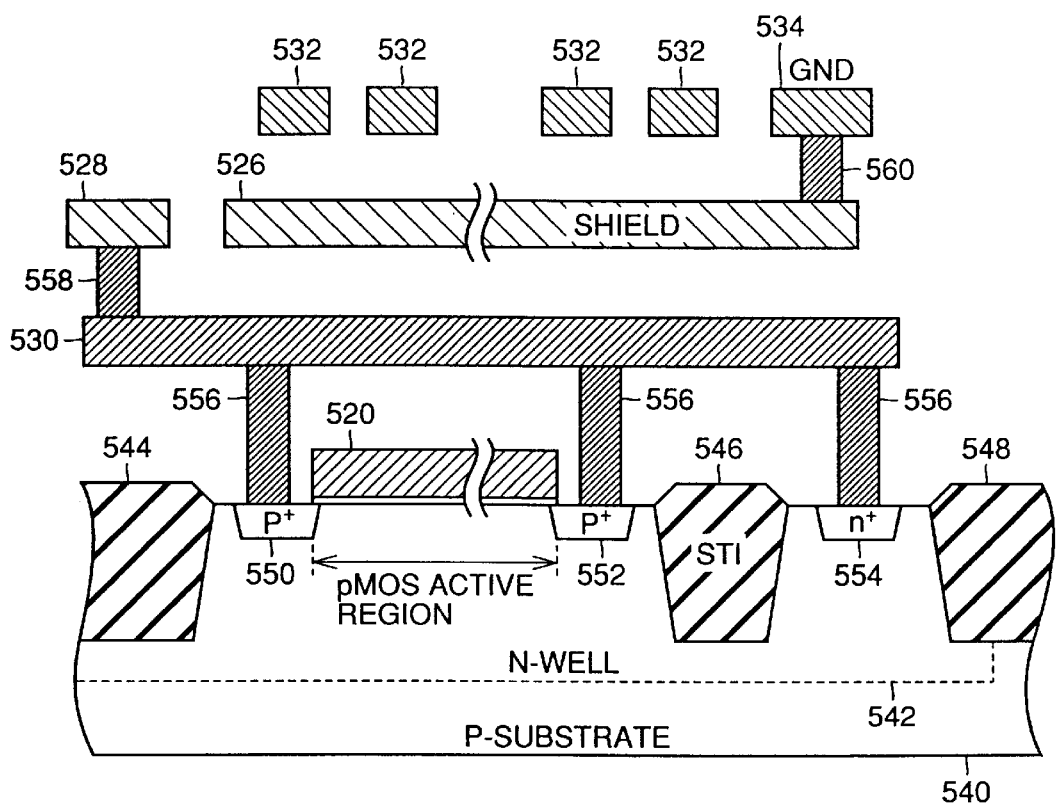
FIG. 16 is a cross section taken along line X—X in FIG. 15.

FIG. 16 is a cross section taken along line X—X in FIG. 15.

Referring to FIGS. 15 and 16, an N-well 542 is formed at a main surface of a P-substrate 540 of silicon, and element isolating bands 544, 546 and 548 defined by shallow trenches are formed above N-well 542. A PMOS capacitor is formed between element isolating bands 544 and 546. This PMOS capacitor includes p-type impurity regions 550 and 552 as a first electrode, and also includes a first polycrystalline silicon layer 520 as a second electrode. An n-type impurity region 554 is formed between isolating bands 546 and 548. In a top view, second polycrystalline silicon layer 530 extends across the PMOS capacitor. Second polycrystalline silicon layer 530 is electrically connected to p-type impurity regions 550 and 552 as well as n-type impurity region 554 via contact windows 556.

Above the second polycrystalline silicon layer 530, first metal interconnection layer 528 forms an interconnection transmitting signal PMP, and first metal interconnection layer 526 forms a shield covering the PMOS. First metal interconnection layer 528 and second polycrystalline silicon layer 530 are electrically connected together via a contact window 558.

Interconnections 532, which include data lines, control signal lines and others, and are formed of the second metal interconnection layer, are located above shield 526. A second metal interconnection layer 534 supplied with the ground potential is arranged beside interconnection 532. Second and first interconnection layers 534 and 526 are electrically connected together via a contact window 560. The first and second metal interconnection layers are preferably made of aluminum, but may be made of another kind of metal.

PMOS capacitor 506 in FIG. 14 receives signal PMP on one of its nodes. Signal PMP is transmitted via interconnection 528 to a position near the interconnection region where pump portion 500 is arranged. Near the interconnection region, interconnection 528 is connected to second polycrystalline silicon layer 530. Second polycrystalline silicon layer 530 may be made of another interconnection material such as a metal layer of tungsten.

Although not shown, the other node N13 of PMOS capacitor 506 is likewise connected to the second polycrystalline silicon layer, and then is connected to first polycrystalline silicon layer 520 at the lower level.

As described above, the opposite nodes of PMOS capacitor 506 of the pump portion are formed of the interconnection layers, all of which are located at the lower level than the first metal interconnection layer. Further, shield 526 which is formed of the first metal interconnection layer and is fixed to the ground potential is arranged in the interconnection region. Thereby, interconnections 532 such as data lines and control signal lines are shielded from the opposite nodes of PMOS capacitor 506. Therefore, noises are not transmitted onto interconnections 532 such as data lines and control signal lines even in such a case that the Vpp pump circuit is activated, and the potential on second polycrystalline silicon layer 530 and others periodically change between external power supply potential ext.Vdd and the ground potential.

According to the arrangement of the fourth embodiment, as described above, the Vpp pump circuit can be arranged in the interconnection area, and can be arranged near the load circuit such as a memory array, which consumes the current. Since the data line and the control signal line are shielded from the nodes of the capacitor of the Vpp pump circuit, it is possible to suppress transmission of noises caused by the pump operation onto the data lines and control signal lines.

FIFTH EMBODIMENT

In the fourth embodiment described above, the Vpp pump circuit is arranged under the data lines and control signal lines. It is desirable that the Vpp pump circuit is shielded from the data lines and control signal lines by the shield layer for preventing noise transmission. However, the shield layer cannot be arranged over the whole area between them in some cases.

This does not cause a problem if a portion which is not shielded is relatively small. However, attention must be given particularly to the case where a complementary data line system is employed. The complementary data line system is such a system that reading and writing of data are performed using two data lines, which transmit the data itself to be transmitted and an inverted value of the data, respectively. This system has an advantage that data transmission can be performed with a small amplitude, and noise transmission can be effectively suppressed.

When noises caused by Vpp pump circuit are transmitted onto only one of the complementary data lines, the potential difference between the complementary data lines changes, which may cause malfunction of circuits such a differential amplifier circuit located on the next stage for detecting and amplifying the potential difference between the complementary data lines.

Figure 17:
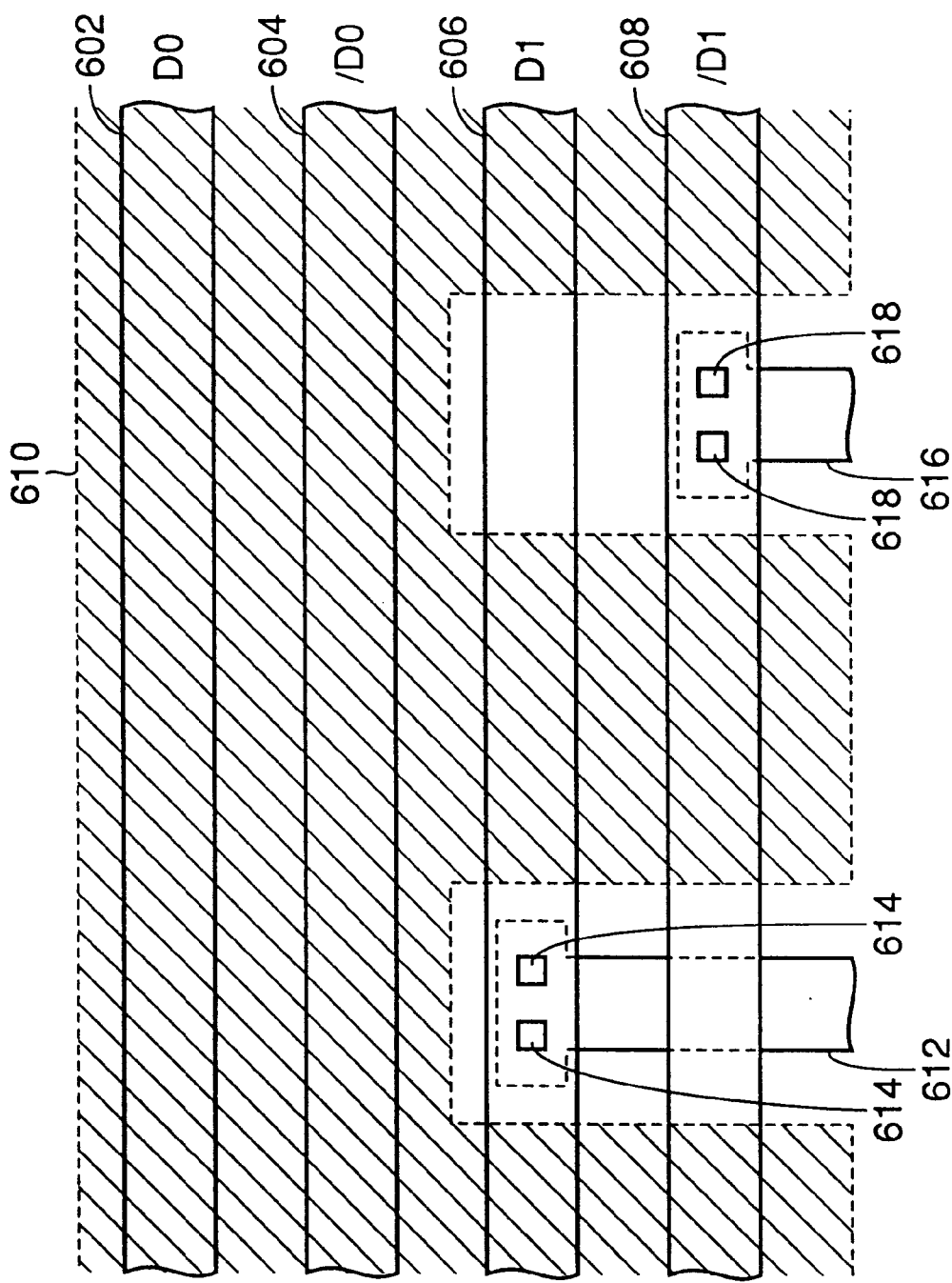
FIG. 17 shows a preferable shield form.

FIG. 17 shows a preferable configuration of the shield.

Referring to FIG. 17, data lines 602, 604, 606 and 608 are arranged in parallel with each other for transmitting data D0, /D0, D1 and /D1, respectively. A shield 610 is arranged under them. For transmitting data D1 and /D1 to the neighboring memory array, however, data lines 606 and 608 are connected to leader interconnections 612 and 616 via contact windows 614 and 618, respectively.

In a certain kind of memory array structure, leader interconnections 612 and 616 must be formed of the same interconnection layer as shield 610. In this case, the shield is partially recessed to arrange the leader interconnections because another manner cannot be employed.

In the above case, it is desired that the recessed portion of the shield has a configuration exposing both the paired complementary data lines. According to this structure, local noises which are sent from the Vpp pump circuit due to partial removal of the shield are transmitted commonly onto both the paired complementary data lines, and the potential difference between the paired complementary data lines is kept so that an influence by noises can be suppressed. Accordingly, shield 610 is provided with the recessed portion likewise exposing data line D1 through an area similar to an exposed area of data line /D1, which is exposed for providing leader line 616.

Figure 18:
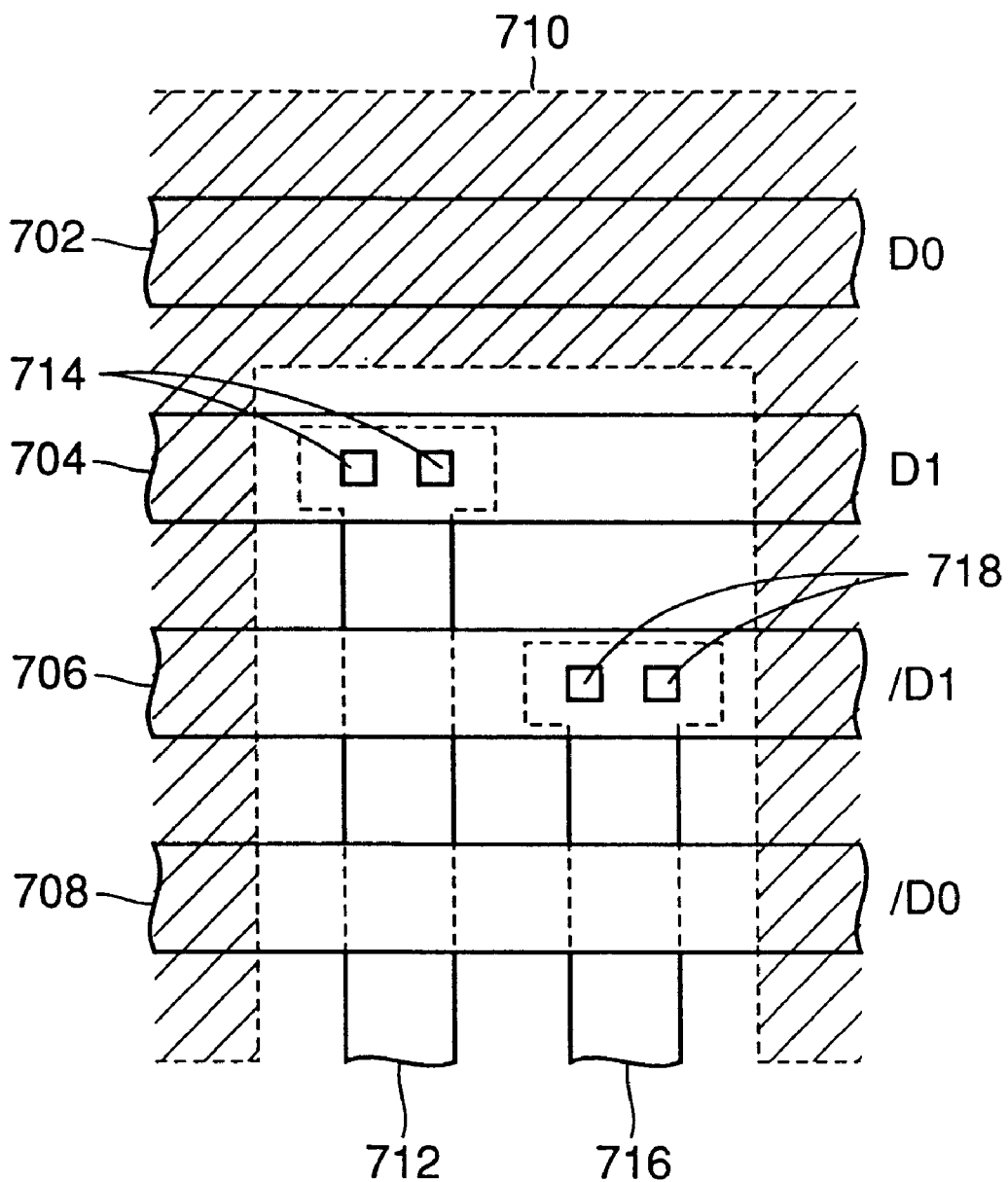
FIG. 18 shows an unpreferable example of removal of the shield layer.

FIG. 18 shows an unpreferable example of removal of the shield layer.

Referring to FIG. 18, data lines 702 and 708 for transmitting data D0 and /D0 are arranged in parallel with and on the opposite sides of data lines 704 and 706 transmitting data D1 and /D1. Leader lines 712 and 716 are connected to data lines 704 and 706 via contact windows 714 and 718, respectively.

Shield layer 710 is provided with a recess for arranging leader lines 712 and 716. In this structure, data line 708 has an exposed portion which is not covered with shield layer 710, but data line 702 does not have an exposed portion. Therefore, noises caused by the Vpp pump circuit are more likely to be transmitted onto data /D0, and are less likely to be transmitted onto data D0.

Figure 19:
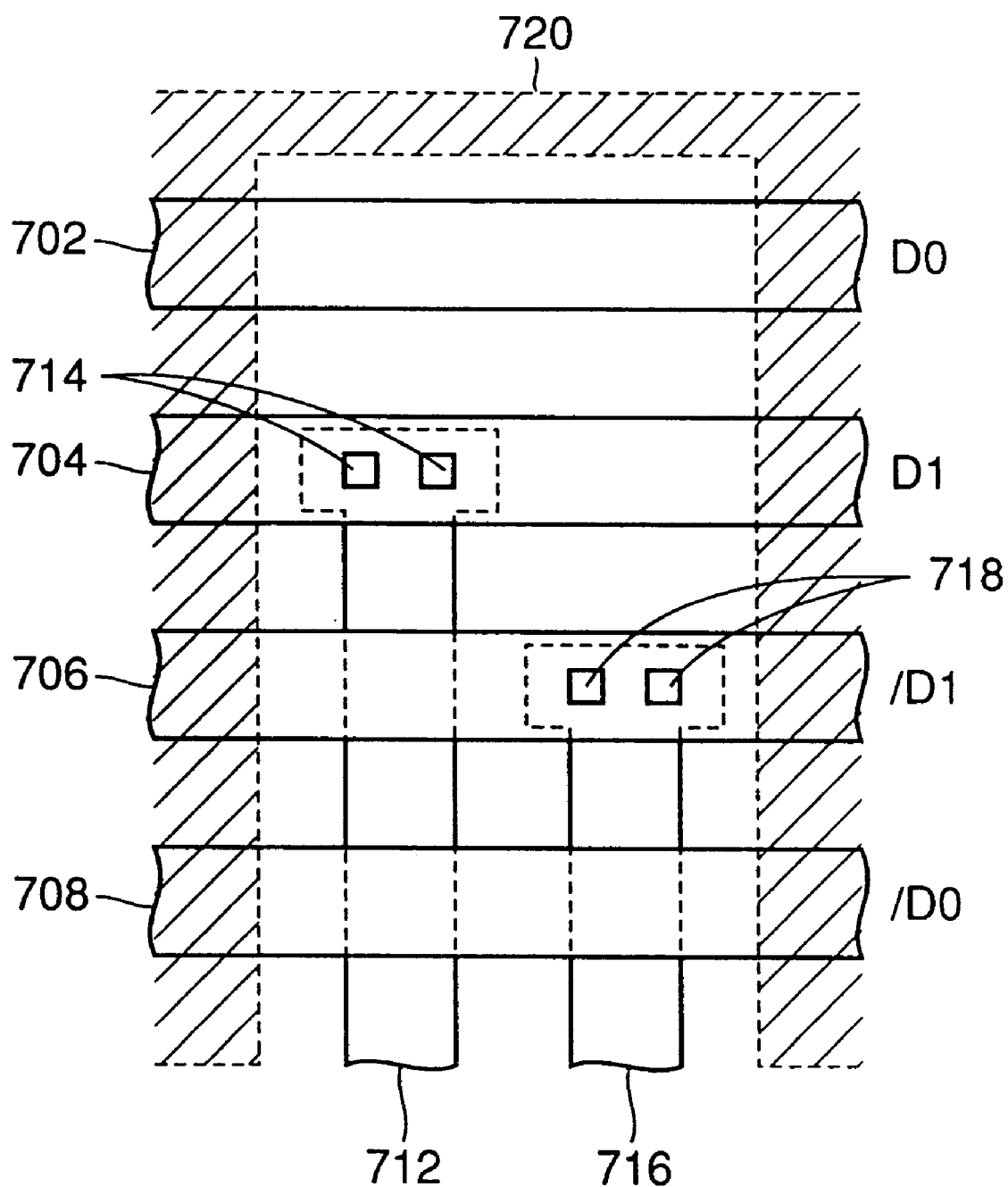
FIG. 19 shows an example of improvement of the unpreferable example in FIG. 18.

FIG. 19 is an example of an improvement of the unpreferable example shown in FIG. 18.

Referring to FIG. 19, a shield layer 720 has a recess extending over data line 702 in contrast to shield layer 710 shown in FIG. 18.

According to this structure, noises caused by the Vpp pump circuit are commonly transmitted onto data /D0 and data D0. This lowers the possibility of malfunction of a differential amplifier arranged in the next stage for detecting the potential difference.

As described above, the fifth embodiment relates to the case where the shield layer is arranged for isolating the data interconnections from noises generated by the Vpp pump circuit, and particularly relates to the case where the shield layer covering the data lines must be partially removed for a certain reason. In the above case, the shield of the fifth embodiment is removed also from the data line complementary to the above data line so that the influence of noises can be suppressed even in the above case.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   first and second memory regions including at least first and second memory blocks, respectively, arranged in positions opposed to each other with a central region therebetween, and arranged along a first direction;
   a trunk line for transmitting an internal power supply potential,
   said trunk line including
      a first portion provided corresponding to said first memory region, and arranged on a portion of said central region and along a second direction perpendicular to said first direction,
      a second portion provided corresponding to said second memory region, and arranged on a portion of said central region along said second direction, and
      a third portion connecting a substantial mid-point of said first portion and a substantial mid-point of said second portion together, and arranged along said first direction; and
   an internal power supply potential generating circuit for issuing the internal power supply potential to said trunk line,
   said internal power supply potential generating circuit including
      a reference potential generating circuit for generating a reference potential,
      a detecting circuit arranged in said central region for performing potential detection by comparing the potential on said third portion with said reference potential, and
      a potential drive circuit for driving the potential on said trunk line in accordance with an output of said detecting circuit.

2. The semiconductor memory device according to claim 1, wherein said detecting circuit monitors the potential on a substantial mid-point of said third portion.

3. The semiconductor memory device according to claim 1, wherein
said first memory region further includes a third memory block aligned in said second direction with respect to said first memory block,
said second memory region further includes a fourth memory block aligned in said second direction with respect to said second memory block,
said first portion of said trunk line is provided commonly to said first and third memory blocks, and
said second portion of said trunk line is provided commonly to said second and fourth memory blocks.

4. The semiconductor memory device according to claim 3, wherein
said trunk line further includes:
a fourth portion connecting an end of said first portion to an end of said second portion, and
a fifth portion connecting the other end of said first portion to the other end of said second portion.

5. The semiconductor memory device according to claim 1, wherein
each of said first and second memory blocks includes a drive circuit for driving a word line,
said internal power supply potential is a boosted potential corresponding to an active level of said word line, and
said internal power supply potential generating circuit supplies said boosted potential to said drive circuit.

6. The semiconductor memory device according to claim 1, wherein
each of said first and second memory blocks includes a drive circuit for driving a word line,
said internal power supply potential is a negative potential corresponding to an inactive level of said word line, and
said internal power supply potential generating circuit supplies said negative potential to said drive circuit.

7. A semiconductor memory device to be arranged on a semiconductor substrate, comprising:
a memory block;
an interconnection group for transmitting data to and from said memory block;
an internal power supply potential generating circuit for supplying an internal power supply potential to said memory block,
said internal power supply potential generating circuit including
a reference potential generating circuit for generating a reference potential,
a detecting circuit for performing potential detection by comparing said internal power supply potential with said reference potential, and
a potential drive circuit for driving said internal power supply potential in accordance with the output of said detecting circuit,
said potential drive circuit including a capacitor having at least a portion formed in an interconnection region provided with said interconnection group; and
a shield layer arranged between said capacitor and said interconnection group, and supplied with a fixed potential.

8. The semiconductor memory device according to claim 7, wherein
said capacitor includes
a well region of a first conductivity type arranged on said semiconductor substrate,
an oxide film formed at a main surface of said semiconductor substrate and covering a portion of said well region,
an electrode covering said oxide film, and
an impurity region of a second conductivity type arranged in said well region and being in contact with a lower region of said electrode;
said well region is electrically connected to said impurity region;
said shield layer is formed of an electrically conductive first interconnection layer covering said capacitor; and
said interconnection group is arranged above said first interconnection layer and is formed of a second interconnection layer.

9. The semiconductor memory device according to claim 7, wherein
said interconnection group includes first and second data lines for transmitting a pair of complementary data, and
said shield layer has an opening located under a first portion of said first data line and a second portion of said second data line corresponding to said first portion for equalizing noises received on said first data line to noises received on said second data line.

10. The semiconductor memory device according to claim 7, wherein
said memory block includes a drive circuit for driving a word line,
said internal power supply potential is a boosted potential corresponding to an active level of said word line, and
said internal power supply potential generating circuit supplies said boosted potential to said drive circuit.

11. The semiconductor memory device according to claim 7, wherein
said memory block includes a drive circuit for driving a word line,
said internal power supply potential is a negative potential corresponding to an inactive level of said word line, and
said internal power supply potential generating circuit supplies said negative potential to said drive circuit.

* * * * *